(12) United States Patent
Kanbe

(10) Patent No.: US 8,643,757 B2
(45) Date of Patent: Feb. 4, 2014

(54) METHOD OF PRODUCING SOLID STATE IMAGING DEVICE WITH OPTIMIZED LOCATIONS OF INTERNAL ELECTRICAL COMPONENTS

(75) Inventor: Hideo Kanbe, Kanagawa (JP)

(73) Assignee: Sony Corporation, Tokyo (JP)

( * ) Notice: Subject to any disclaimer, the term of this patent is extended or adjusted under 35 U.S.C. 154(b) by 454 days.

(21) Appl. No.: 12/461,932

(22) Filed: Aug. 28, 2009

(65) Prior Publication Data

US 2009/0317936 A1 Dec. 24, 2009

Related U.S. Application Data

(62) Division of application No. 11/472,430, filed on Jun. 22, 2006, now Pat. No. 8,446,508.

(30) Foreign Application Priority Data

Jul. 27, 2005 (JP) .................................. 2005-217624
Jul. 29, 2005 (JP) .................................. 2005-220939

(51) Int. Cl.
*H04N 3/14* (2006.01)
*H04N 5/335* (2011.01)

(52) U.S. Cl.
USPC ........................................ 348/311; 250/208.1

(58) Field of Classification Search
USPC ........ 348/294–324; 250/208.1; 257/291–292, 257/294–324
See application file for complete search history.

(56) References Cited

U.S. PATENT DOCUMENTS

| 5,043,783 | A | * | 8/1991 | Matsumoto et al. | 257/461 |
| 5,181,093 | A | * | 1/1993 | Kawaura | 257/223 |
| 5,476,808 | A | * | 12/1995 | Kusaka et al. | 438/75 |
| 5,604,364 | A | * | 2/1997 | Ohmi et al. | 257/291 |
| 2001/0015435 | A1 | * | 8/2001 | Suzuki et al. | 257/1 |
| 2002/0125409 | A1 | * | 9/2002 | Nagano | 250/208.1 |
| 2003/0178551 | A1 | * | 9/2003 | Ozawa | 250/208.1 |

FOREIGN PATENT DOCUMENTS

| JP | 61-114663 A | 6/1986 |
| JP | 62-208668 A | 9/1987 |
| JP | 06-244402 A | 9/1994 |
| JP | 10-144906 A | 5/1998 |
| JP | 2866351 B2 | 12/1998 |
| JP | 11-026745 A | 1/1999 |
| JP | 3123068 B2 | 10/2000 |
| JP | 2001-057421 A | 2/2001 |
| JP | 2002-057325 A | 2/2002 |
| JP | 3320589 B2 | 6/2002 |
| JP | 2003-007997 A | 1/2003 |
| JP | 2003-258233 A | 9/2003 |
| JP | 2003-347537 A | 12/2003 |

* cited by examiner

*Primary Examiner* — Nelson D. Hernández Hernández
(74) *Attorney, Agent, or Firm* — Rader, Fishman & Grauer PLLC

(57) ABSTRACT

A solid state imaging device improving and stabilizing imaging characteristic by optimizing a location of a positive hole accumulation layer to an electrode at the periphery of a light receiving portion, and having light receiving portions formed on a substrate and electrodes formed on the substrate at the periphery of the light receiving portion, each electrode including at least a first electrode to which a positive voltage is applied and a second electrode to which only 0 volt or a negative polarity voltage is applied, each light receiving portion having a signal charge accumulation region formed on the substrate and a positive hole accumulation region formed in a surface layer portion of the signal charge accumulation region, each positive hole accumulation region arranged at a distance from the first electrode and arranged so as to overlap the second electrode, and method of producing the same and a camera.

19 Claims, 27 Drawing Sheets

METHOD OF PRODUCING SOLID STATE IMAGING DEVICE WITH OPTIMIZED LOCATIONS OF INTERNAL ELECTRICAL COMPONENTS

CROSS REFERENCES TO RELATED APPLICATIONS

This is a Divisional Application of the patent application Ser. No. 11/472,430, filed Jun. 22, 2006, which claims priority from Japanese Patent Application No. 2005-217624 filed in the Japan Patent Office on Jul. 27, 2005 and Japanese Patent Application No. 2005-220939 filed in the Japan Patent Office on Jul. 29, 2005, the entire contents of which being incorporated herein by reference.

BACKGROUND OF THE INVENTION

1. Field of Invention

The present invention relates to a solid state imaging device, a method of producing the same and a camera, more particularly relates to a solid state imaging device having light receiving portions configured by embedded photodiodes, a method of producing the same and a camera.

Further, the present invention particularly relates to a charge coupled device (CCD) type solid state imaging device, a method of producing the same and a camera.

2. Description of the Related Art

An embedded photodiode is employed as a light receiving portion of a CCD. In an embedded photodiode, all of the pn junctions exist in the substrate, therefore dark current is suppressed. A light receiving portion formed by an embedded photodiode has an n-type charge accumulation layer and a $p^+$-type positive hole accumulation layer formed in a surface layer of the charge accumulation layer.

The charge accumulation layer and the positive hole accumulation layer are formed by ion implantation after forming a transfer electrode (refer to, for example, Japanese Patent No. 3320589). The location of the n-type charge accumulation layer exerts an influence upon the read-out voltage and blooming characteristics, therefore these characteristics can be stabilized by forming the charge accumulation layer by self alignment with the transfer electrode. Further, the location of the positive hole accumulation layer exerts an influence upon the read-out voltage and dark current value, therefore these characteristics can be stabilized by forming the positive hole accumulation layer by self alignment with respect to the transfer electrode.

For the n-type charge accumulation layer, the method of forming the same by the ion implantation before the formation of the transfer electrode is disclosed in, for example, Japanese Patent No. 2866351. This process became possible by improvement of the overlay precision in exposure systems. By forming the n-type charge accumulation layer before the formation of the transfer electrode, the charge accumulation layer is enlarged and the sensitivity can be improved.

Further, in order to increase the amount of the charge handled by the vertical transfer portion (vertical transfer CCD) of a CCD solid state imaging device and realize both full pixel reading and thinning of the pixel signals, it is necessary to prepare three or more transfer electrodes per pixel and drive three or more phases.

The above transfer electrodes have been formed by using three or more polycrystalline silicon layers. In this case, the transfer electrodes are arranged with their ends superimposed on each other. Along with the miniaturization of pixel size, however, the effects of the superimposition of the transfer electrodes and surface relief shapes configuring the vertical transfer portion become conspicuous. Namely, blocking of incident light, that is, blocking of the light which originally should strike the light receiving portion due to a light blocking film, is liable to occur due to the surface relief shapes. As a result of this, the amount of the light incident upon the light receiving portion is reduced. This leads to a reduction of the light sensitivity.

In order to reduce the surface relief shapes of vertical transfer portions, a method of forming transfer electrodes having a single-layer structure by one polycrystalline silicon layer is proposed in, for example, Japanese Patent Publication (A) No. 2003-7997. In the method disclosed, however, it is necessary to connect the transfer electrodes in the horizontal direction, therefore two or more interconnects have to be laid between pixels. In this case, it suffers from the disadvantages that the distance between adjacent pixels in the vertical direction becomes larger, the areas of the light receiving portions are reduced, and the light sensitivity and the amount of charge handled by the light receiving portions are reduced. There is also the method of making the potential of the light receiving portions deeper to maintain the amount of charge handled, but in this case, there is the disadvantage that the read-out voltage becomes high.

A structure using single-layer structure transfer electrodes and providing drive interconnects (shunt interconnects) to supply transfer pulses to the transfer electrodes in a layer above the transfer electrodes is disclosed in, for example, Japanese Patent No. 3123068. However, most structures provide the drive interconnects along the vertical transfer portions in the vertical direction. When arranging the drive interconnects in the vertical direction, it suffers from the disadvantages that the transfer mode is restricted and it is hard to realize the thinned out transfer of pixels.

SUMMARY OF THE INVENTION

Since positive hole accumulation layers are formed by self alignment with the transfer electrodes, from the viewpoint of the improvement or stabilization of the imaging characteristics, it is difficult to optimize an arrangement of the locations of the positive hole accumulation layers with respect to the electrodes on the periphery of the light receiving portions.

In the present invention, it is therefore desirable to provide a solid state imaging device achieving improvement and stabilization of the imaging characteristics by optimizing locations of the positive hole accumulation layers with respect to electrodes on the periphery of the light receiving portions, a method of producing the same and camera relating to the same.

Further, in the present invention, it is therefore desirable to provide a solid state imaging device able to handle a variety of transfer modes and able to improve the light sensitivity, a method of producing the same and camera relating to the same.

According to an embodiment of the present invention, there is provided a solid state imaging device having: a plurality of light receiving portions formed on a substrate; and a plurality of electrodes formed on the substrate at the peripheries of the light receiving portions, wherein each of the electrodes includes at least a first electrode to which a positive voltage is applied and a second electrode to which only 0 (zero) volt or negative polarity voltage is applied, each of the light receiving portions has a signal charge accumulation region formed in the substrate and a positive hole accumulation region formed in a surface layer portion of the signal charge accumulation region, and each of the positive hole accumulation regions is arranged at a distance from the first electrode and arranged overlapping the second electrode.

According to an embodiment of the present invention, there is provided a solid state imaging device having: a plurality of light receiving portions formed on a substrate in a first direction and a second direction perpendicular to the first direction; and a plurality of transfer electrodes formed on the substrate at the peripheries of the light receiving portions, wherein each of the transfer electrodes includes a first transfer electrode formed adjoining the light receiving portion in the first direction and to which a positive read-out voltage and 0 (zero) volt or a negative polarity transfer pulse is applied and a second transfer electrode formed passing between the light receiving portions arranged in the second direction and to which 0 (zero) volt or a negative polarity transfer pulse is applied, each of the light receiving portions has a signal charge accumulation region formed in the substrate and a positive hole accumulation region formed in a surface layer portion of the signal charge accumulation region, and each of the positive hole accumulation region is arranged at a distance from a first transfer electrode in the first direction and arranged overlapping a second transfer electrode in the second direction.

According to an embodiment of the invention, there is provided a method of producing a solid state imaging device, the method having the steps of: forming a signal charge accumulation region in a region forming a plurality of light receiving portions arranged on the substrate; forming a positive hole accumulation region in a surface layer portion of the signal charge accumulation region; and forming an electrode on the substrate at the periphery of the light receiving portion, wherein the step of forming the electrode includes a step of forming at least a first electrode to which a positive voltages is applied and a second electrode to which only 0 volt or a negative polarity voltage is applied and the step of forming the positive hole accumulation region includes a step of forming the positive hole accumulation region so as to be arranged at a distance from the first electrode and arranged so as to overlap the second electrode.

According to an embodiment of the present invention, there is provided a method of producing a solid state imaging device, the method having the steps of: forming a plurality of signal charge accumulation regions in a region forming light receiving portions arranged on a substrate in a first direction and in a second direction perpendicular to the first direction; forming a positive hole accumulation region in a surface layer portion of the signal charge accumulation region; and forming a transfer electrode on the substrate at the periphery of the light receiving portion, wherein the step of forming the transfer electrode includes a step of forming a first transfer electrode formed adjoining the light receiving portion in the first direction and to which a positive read-out voltage and 0 volt or a negative polarity transfer pulse is applied and a second transfer electrode formed passing between the light receiving portions arranged in the second direction and to which 0 volt or a negative polarity transfer pulse is applied, and the step of forming the positive hole accumulation region includes a step of forming the positive hole accumulation region so as to be arranged at a distance from a first transfer electrode in the first direction and arranged overlapping a second transfer electrode in the second direction.

According to an embodiment of the invention, there is provided a camera having: a solid state imaging device; an optical system configured to focus light onto an imaging surface of the solid state imaging device; and a signal processing circuit configured to perform predetermined signal processing for outputting signals from the solid state imaging device, wherein the solid state imaging device has a plurality of light receiving portions formed on a substrate and electrodes formed on the substrate at the peripheries of the light receiving portions, each of the electrodes includes at least a first electrode to which a positive voltage is applied and a second electrode to which only 0 volt or negative polarity voltage is applied, each of the light receiving portions has a signal charge accumulation region formed in the substrate and a positive hole accumulation region formed in a surface layer portion of the signal charge accumulation region, and each of the positive hole accumulation regions is arranged at a distance from a first electrode and arranged overlapping a second electrode.

In an embodiment of the present invention described above, the positive hole accumulation region of the light receiving portion is arranged at a distance from the first electrode to which the positive voltage is applied and formed so as to overlap the second electrode. In this way, the positive hole accumulation region is formed before the step of formation of the transfer electrode in order to optimize a location of the positive hole accumulation region.

Further, according to an embodiment of the present invention, there is provided a solid state imaging device having: a plurality of light receiving portions arranged in a matrix; a plurality of transfer channels arranged adjacent to rows of the light receiving portions; a plurality of first transfer electrodes arranged on the transfer channels and extending in a column direction while passing between the light receiving portions; second transfer electrodes and third transfer electrodes each being arranged in the same layer as the first transfer electrode on the transfer channels and arranged separated from each other; a first drive interconnect extending in the column direction while passing between the light receiving portions on the first transfer electrodes and connecting the second transfer electrodes adjacent in the column direction; and a second drive interconnect extending in the column direction while passing between the light receiving portions on the first drive interconnect and connecting the third transfer electrodes adjacent in the column direction.

According to an embodiment of the present invention, there is provided a method of producing a solid state imaging device, the method having the steps of: forming a plurality of light receiving portions arranged on a substrate in a matrix and a plurality of transfer channels arranged adjacent to rows of the light receiving portions by introduction of an impurity into the substrate; depositing a conductive layer on the substrate; processing the conductive layer to form a plurality of transfer electrodes extending in the column direction while passing between the light receiving portions and second transfer electrodes and third transfer electrodes arranged separated from each other on the transfer channels; forming a first drive interconnect extending in the column direction while passing between the light receiving portions and connecting the second transfer electrodes adjacent in the column direction on the first transfer electrodes; and forming a second drive interconnect extending in the column direction while passing between the light receiving portions and connecting the third transfer electrodes adjacent in the column direction on the first drive interconnect.

According to an embodiment of the present invention, there is provided a camera having: a solid state imaging device; an optical system configured to focus light onto an imaging surface of the solid state imaging device; and a signal processing circuit configured to perform predetermined signal processing for outputting signals from the solid state imaging device, wherein the solid state imaging device has a plurality of light receiving portions arranged in a matrix, a plurality of transfer channels arranged adjacent to rows of the light receiving portions, a plurality of first transfer electrodes arranged on the transfer channels and extending in a column direction while passing between the light receiving portions, second transfer electrodes and third transfer electrodes each being arranged in the same layer as the first transfer electrode on the transfer channels and arranged while being separated from each other, a first drive interconnect extending in the column direction while passing between the light receiving portions on the first transfer electrodes and connecting the second transfer electrodes adjacent in the column direction, and a second drive interconnect extending in the column direction while passing between the light receiving portions on the first drive interconnect and connecting the third transfer electrodes adjacent in the column direction.

In an embodiment of the present invention described above, the first transfer electrodes, the first drive interconnect, and the second drive interconnect are arranged overlapping between light receiving portions adjacent in the row direction. For this reason, the width between light receiving portions adjacent in the row direction may need only be one interconnect width.

Further, transfer pulses having the same phases can be supplied to the second transfer electrodes in the same column by the first drive interconnect extending in the column direction, and transfer pulses having the same phases can be supplied to the third transfer electrodes in the same column by the second drive interconnect extending in the column direction. For this reason, the present invention can handle a variety of transfer modes such as three-phase drive, six-phase drive, and nine-phase drive. Further, it can handle various types of transfer modes such as full pixel reading (progressive scan), frame reading (frame integration), and field reading (field integration).

According to an embodiment of the present invention, a solid state imaging device and camera can be improved and the imaging characteristics can be stabilized by optimizing the locations of the positive hole accumulation layers with respect to the electrodes at the periphery of the light receiving portions.

Further, according to an embodiment of the present invention, a solid state imaging device and camera, able to handle a variety of transfer modes and improve the light sensitivity, can be provided.

BRIEF DESCRIPTION OF THE DRAWINGS

These and other features of the present invention will become clearer from the following description of the preferred embodiments given with reference to the attached drawings, wherein.

DESCRIPTION OF THE PREFERRED EMBODIMENTS

Preferred embodiments of the present invention will be described with reference to the drawings. In the figures, the same notations are attached to the same components. In the embodiment, there is described an example of applying the present invention to a charge coupled device (CCD) type solid state imaging device of an interline-transfer type. Note that the transfer method is not particularly limited.

Figure 1:
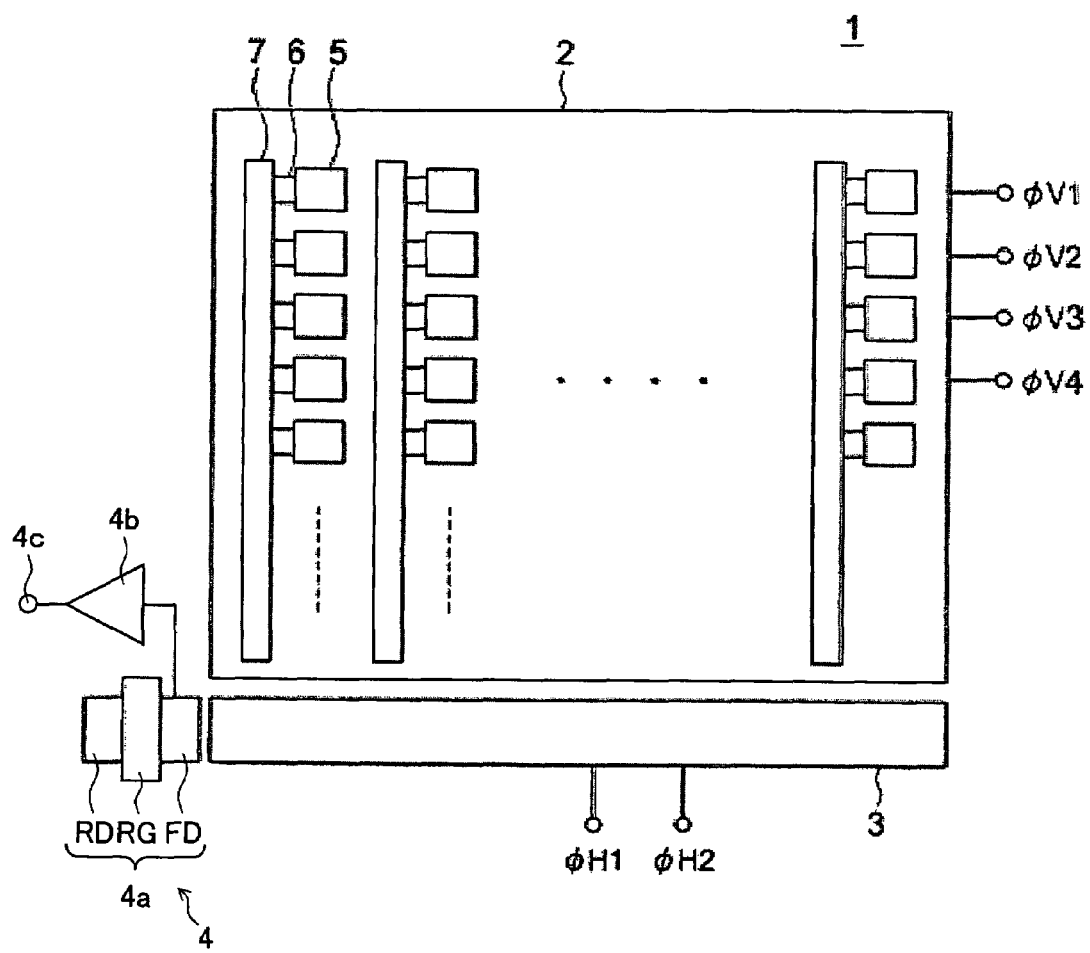
FIG. 1 is a schematic view of the configuration of an example of a solid state imaging device according to an embodiment of the present invention.

FIG. 1 is a schematic view of the configuration of an example of a solid state imaging device according to the first embodiment of the present invention. The solid state imaging device 1 according to the first embodiment has an imaging portion 2, a horizontal transfer portion 3, and an output portion 4.

The imaging portion 2 has a plurality of light receiving portions 5 arranged in a matrix for each pixel, a plurality of vertical transfer portions 7 arranged for each vertical row of the light receiving portions 5, and read-out gate portions 6 arranged between the light receiving portions 5 and the vertical transfer portions 7.

The light receiving portions 5 are made of, for example, embedded photodiodes which opto-electrically convert image light (incident light), incident from an object to be imaged, to signal charges of amounts in accordance with the light amounts, and store the same. The read-out gate portions 6 read out the signal charges accumulated in the light receiving portions 5 to the vertical transfer portions 7.

The vertical transfer portions 7 are driven by, for example, transfer pulses $\phi V1$, $\phi V2$, $\phi V3$, and $\phi V4$ of four phases and transfer the signal charges read out from the light receiving portions 5 in the vertical direction (downward direction in the figure). Note that the transfer pulses are not limited to four phases. The transfer pulses $\phi V1$ to $\phi V4$ are, for example, 0 V or −7 V.

The horizontal transfer portion 3 is driven by the transfer pulses $\phi H1$ and $\phi H2$ of two phases and transfers the signal charges vertically transferred from the vertical transfer portions 7 in a horizontal direction (leftward direction in the figure).

The vertical transfer portions 7 and the horizontal transfer portion 3 have transfer channels formed in the substrate extending in the transfer direction and a plurality of transfer electrodes formed lined up in the transfer direction in a state where insulation films are interposed on the transfer channels.

The output portion 4 converts the signal charges horizontally transferred by the horizontal transfer portion 3 to electric signals and outputs the same. The output portion 4 is configured by, for example, a floating diffusion amplifier. The output portion 4 has a transistor 4a formed by a floating diffusion FD, a reset gate RG, and a reset drain RD, an amplifier 4b, and an output terminal 4c.

The voltage of the floating diffusion FD changes in accordance with the amount of signal charges horizontally transferred by the horizontal transfer portion. The voltage of the floating diffusion FD is amplified by the amplifier 4b and extracted as an analog signal by the output terminal 4c. Thereafter, the reset pulse is input to the reset gate RG, the transistor 4a is switched to the ON state, and the signal charges of the floating diffusion FD are swept away to the reset drain RD. Note that a power supply voltage Vdd is applied to the reset drain RD.

Figure 2:
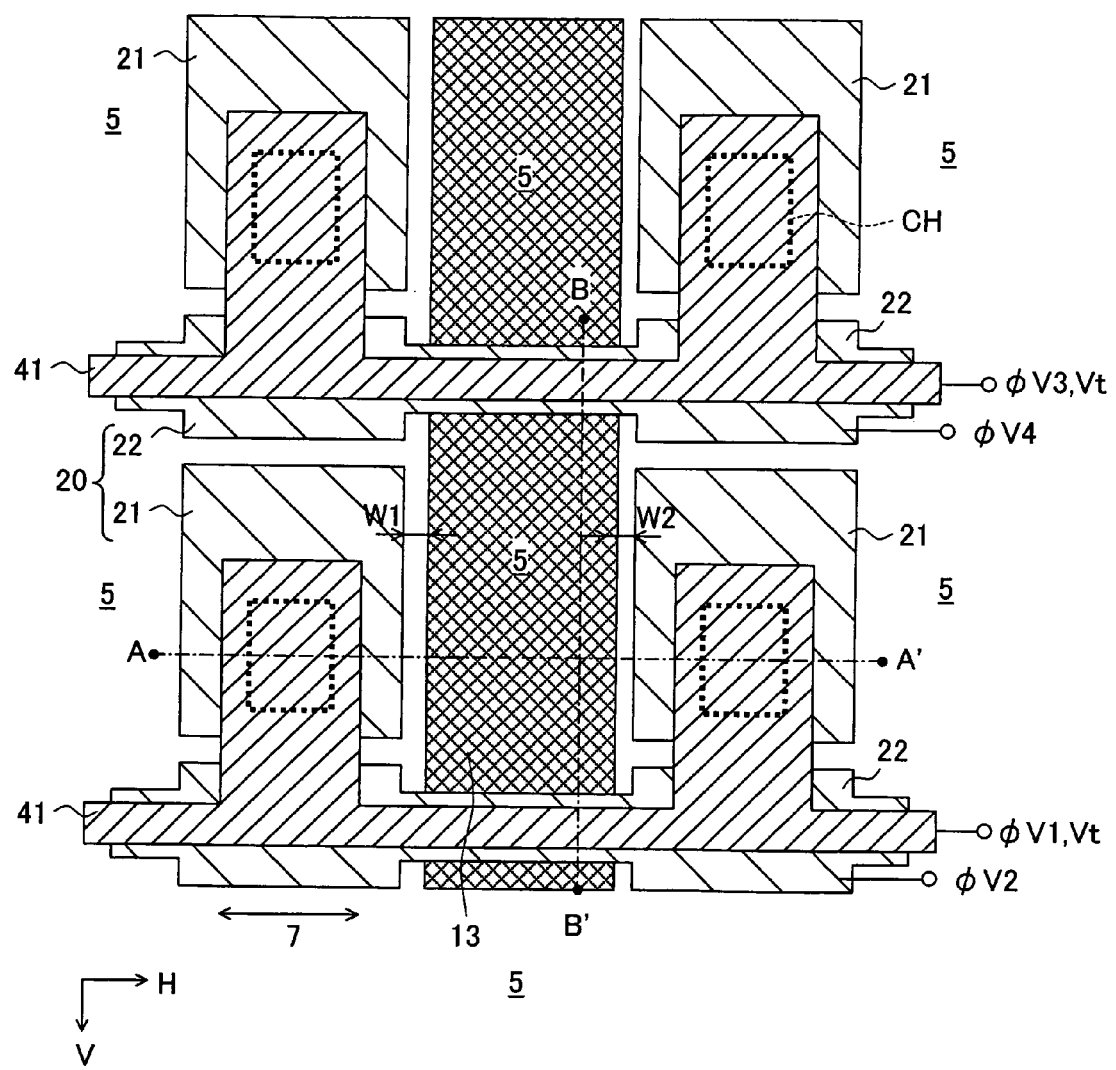
FIG. 2 is a plan view of elementary portions of an imaging portion.

FIG. 2 is a plan view of elementary portions in the imaging portion 2. In FIG. 2, only the transfer electrodes are illustrated.

The light receiving portions 5 are arranged in the horizontal direction (first direction) H and the vertical direction (second direction) V. The light receiving portions 5 have $p^+$-type positive hole accumulation regions 13 in the surface layer portions of the substrate.

On the substrate at the periphery of the light receiving portions 5, transfer electrodes 20 are formed via insulation films. In the present embodiment, the transfer electrodes (electrodes) 20 include first transfer electrodes (first electrodes) 21 and second transfer electrodes (second electrodes) 22. When it is not necessary to differentiate between the first transfer electrodes 21 and the second transfer electrodes 22, these will be simply referred to as "the transfer electrodes 20".

The transfer electrodes 20 have single-layer structures which, for example, are formed by single layers of polycrystalline silicon. In the first embodiment, two transfer electrodes are arranged for each light receiving portion 5.

A first transfer electrode 21 is arranged adjacent to each light receiving portion 5 in the horizontal direction. The first transfer electrodes 21, arranged corresponding to the different light receiving portions 5, are arranged isolated in the horizontal and vertical directions.

A second transfer electrode 22 is arranged passing between the light receiving portions 5 adjacent in the vertical direction and extending in the horizontal direction. In each vertical transfer portion 7, the first transfer electrodes 21 and the second transfer electrodes 22 are alternately arranged.

Each first drive interconnect 41 extending in the horizontal direction is arranged so as to overlap the second transfer electrode 22 extending in the horizontal direction. The first drive interconnects 41 are formed on the second transfer electrodes 22 via the insulation film. The first drive interconnects 41 extend in the vertical direction on the vertical transfer portions 7 and are connected to the first transfer electrodes 21 via contact holes CH.

Each first drive interconnect 41 is formed by polycrystalline silicon, tungsten or another metal material, or a silicide-based material. When using a metal material for the first drive interconnects 41, an equivalent resistance value is obtained even if making the thickness and width smaller in comparison with the case of using polycrystalline silicon, therefore, there is the advantage that step differences formed at the peripheral edges of the light receiving portions 5 can be reduced.

At the time of reading, the positive polarity read-out voltage Vt is applied to the first transfer electrodes 21 via the first drive interconnects 41. The read-out voltage is, for example, +10 to +15V. By the application of the read-out voltage Vt, signal charges (electrons) accumulated in the light receiving portions 5 are read out to the transfer channels under the first transfer electrodes 21.

At the vertical transfer, after reading, transfer pulses $\phi V1$ to $\phi V4$ of 0 V or negative polarity voltage are applied to the first transfer electrode 21, the second transfer electrode 22, the first transfer electrode 21, and the second transfer electrode 22 lined up in the vertical direction. The first transfer electrodes 21 receive the transfer pulses $\phi V1$ and $\phi V3$ via the first drive interconnects 41. The transfer pulses $\phi V1$ to $\phi V4$ are, for example, 0 V or −7 V.

Each positive hole accumulation region 13 is arranged so as to overlap the second transfer electrode 22 adjacent in the vertical direction to which 0 or a negative polarity transfer pulse is applied. Further, each positive hole accumulation region 13 is arranged at a distance from the first transfer electrode 21 adjacent in the horizontal direction to which a positive polarity voltage is applied.

For example, each positive hole accumulation region 13 is arranged spaced from the first transfer electrode 21 on the read-out side (left side in the figure) by exactly an offset amount W1. Further, each positive hole accumulation region 13 is arranged spaced from the first transfer electrode 21 on an opposite side to the read-out side (right side in the figure) by exactly an offset amount W2. The offset amounts W1 and W2 are, for example, 0.1 to 0.3 μm.

Figure 3:
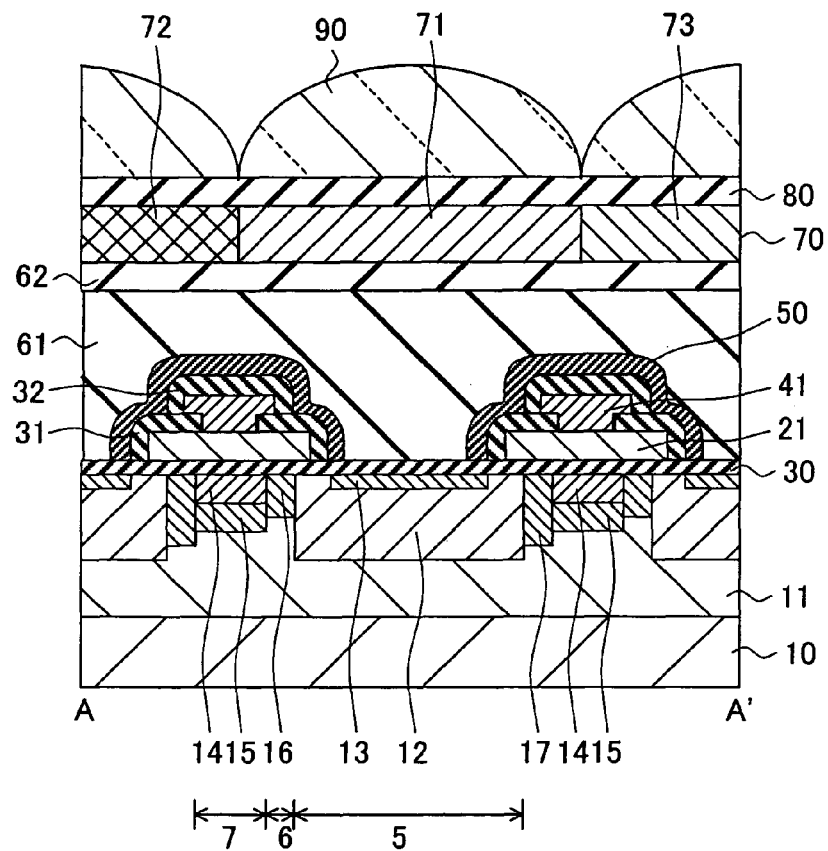
FIG. 3 is a sectional view taken along the line A-A' in FIG. 2.
Figure 4:
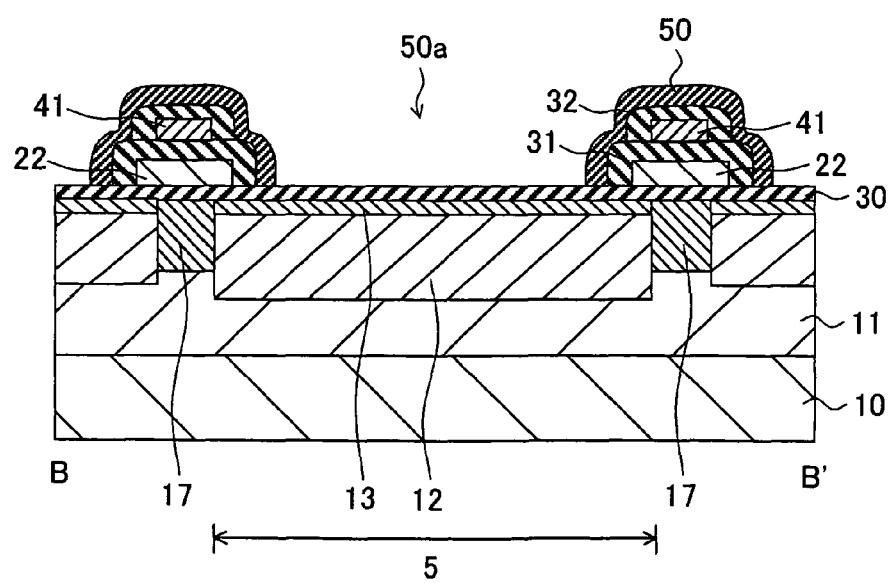
FIG. 4 is a sectional view taken along the line B-B' in FIG. 2.

FIG. 3 is a sectional view taken along a line A-A' in FIG. 2. FIG. 4 is a sectional view taken along a line B-B' in FIG. 2. Note that, the upper layer of the light shielding film is illustrated in only FIG. 3 for simplification of the illustration.

For example, a p-type well 11 is formed in an n-type silicon substrate 10 (hereinafter referred to as the "substrate 10"). The p-type well 11 forms an overflow barrier.

Each light receiving portion 5 has an n-type signal charge accumulation region 12 formed in the p-type well 11 and a p$^+$-type positive hole accumulation region 13 formed in the surface layer of the signal charge accumulation region 12. The positive hole accumulation region 13 is provided to suppress the dark current generated near the surface of the signal charge accumulation region 12, which could become a source of noise.

In each light receiving portion 5, an npn structure is formed by the signal charge accumulation region 12, the p-type well 11, and the substrate 10. This npn structure forms a vertical type overflow drain structure for discharging the signal charges to the substrate 10 side when the signal charges, excessively generated due to strong light incident upon the light receiving portion 5, overcome the overflow barrier formed by the p-type well 11.

Further, each light receiving portion 5 is provided with the function of an electronic shutter. Namely, by making a substrate potential supplied to the substrate 10 the high level (for example, +12 V), the potential barrier of the p-type well 11 is lowered and charges accumulated in the signal charge accumulation region 12 overcome the potential barrier and are swept away in the vertical direction, that is, to the substrate 10. Due to this, the exposure time can be adjusted.

Each vertical transfer portion 7 is configured by an n-type transfer channel 14 formed in the p-type well 11 at a space from the signal charge accumulation region 12 at a predetermined interval and transfer electrodes 21 and 22 formed on the transfer channel 14 via a gate insulation film 30 made of a silicon oxide film and made of, for example, polycrystalline silicon. Under the transfer channel 14, a p-type region 15 having a relatively high concentration is formed. The p-type region 15 forms a potential barrier under the transfer channel 14. For this reason, signal charges opto-electrically converted in a deep portion of the substrate 10 are prevented from entering into the transfer channel 14, and the occurrence of smear is suppressed.

Each read-out gate portion 6 is configured by a p-type read-out gate region 16 between the signal charge accumulation region 12, the transfer channel 14, and a transfer electrode 21 formed on the read-out gate region 16 via the gate insulation film 30. The read-out gate region 16 forms a potential barrier between the n-type signal charge accumulation region 12 and the transfer channel 14. At the time of reading, a positive polarity read-out voltage (for example, +12 V) is applied to the first transfer electrode 21, the potential barrier of the read-out gate region 16 is lowered, and the signal charges are read out from the signal charge accumulation region 12 to the transfer channel 14.

On the opposite side to the read-out side, with respect to the signal charge accumulation region 12, a p-type channel stop region 17 is formed. Further, the channel stop region 17 is formed between light receiving portions 5 adjacent in the vertical direction and under the second transfer electrode 22 (refer FIG. 4). The channel stop region 17 forms a potential barrier with respect to the signal charges and prevents the inflow/outflow of signal charges. Each positive hole accumulation region 13 is arranged so as to overlap the second transfer electrode 22 adjacent in the vertical direction. For this reason, under the second transfer electrode 22, the channel stop region 17 and the positive hole accumulation region 13 are linked.

On the first transfer electrode 21 and the second transfer electrode 22, a first drive interconnect 41 is formed via an insulation film 31. The first transfer electrode 21 and the first drive interconnect 41 are connected via a contact hole formed in the insulation film 31. The first drive interconnect 41 is made of polycrystalline silicon, tungsten or another metal material, or a silicide-based material. The insulation film 32, made of, for example, silicon oxide, is formed covering the first drive interconnect 41.

A light shielding film 50 is formed so as to cover the transfer electrode 20 and the first drive interconnect 41. The light shielding film 50 is made of a high melting point metal such as tungsten. In the light shielding film 50, an opening portion 50a for making the light strike the light receiving portion 5 is formed.

On the light shielding film 50, an inter-layer insulation film 61, made of, for example, borophosphosilicate glass (BPSG), is formed. On the inter-layer insulation film 61, a passivation film 62, made of, for example, silicon nitride, is formed. The surface of the passivation film 62 is flattened.

On the passivation film 62, a color filter 70 is formed. The color filter 70 is, for example, a primary color type and has a green color filter 71, a blue color filter 72, and a red color filter 73. In a case of a complementary color type, the color filter 70 is formed by color filters of cyanogen, magenta, yellow, and green.

On the color filter 70, a flattening film 80, made of, for example, an acrylic thermoplastic resin, is formed. On the flattening film 80, a micro-lens 90 is formed.

In the above solid state imaging device, the incident light is focused by the micro-lens 90 and reaches the color filters 71, 72, and 73. Only light having predetermined wavelength bands passes through the color filters and strikes the light receiving portions 5. The light incident upon the light receiving portions 5 is opto-electrically converted to signal charges, in accordance with the incident light amount, and these signal charges accumulate in the signal charge accumulation region 12. Thereafter, this is read out to the transfer channel 14 and transferred in the vertical direction by the vertical transfer portion 7.

Next, there is described a method of producing a solid state imaging device according to the first embodiment described above, with reference to FIGS. 5A to 5C to FIG. 12. FIGS. 5A to 5C to FIGS. 11A and 11B are sectional views of steps in the production of a solid state imaging device. FIG. 12 is a process flow chart of the solid state imaging device.

Figure 5A:
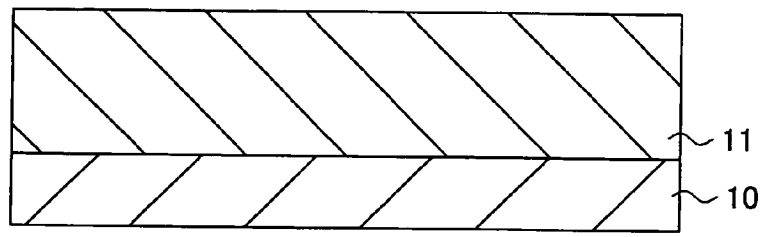
FIGS. 5A to 5C are sectional views of steps in the production of a solid state imaging device according to an embodiment of the present invention.

As shown in FIG. 5A, a substrate 10, made of n-type silicon, is prepared (ST1). As the substrate 10, for example, an n-type CZ substrate on which an n-type epitaxial layer having a resistivity of about 20 to 40 Ωcm is formed to several μm (micrometers) to several tens of μm (micrometers), is used. Then, a p-type well 11 is formed in the substrate 10 by ion implantation (ST2).

Figure 5B:
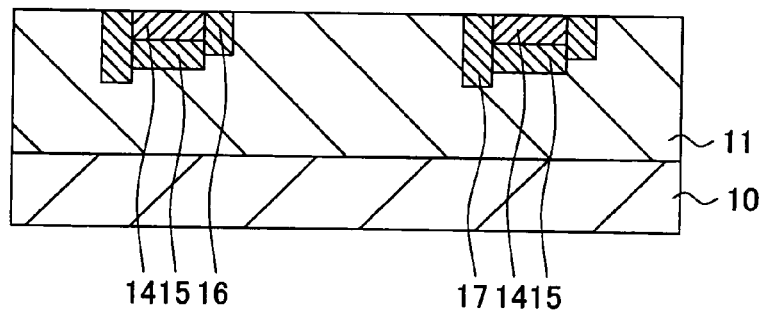

Next, as shown in FIG. 5B, in the substrate 10, by the ion implantation method, an n-type transfer channel 14, a p-type region 15, a p-type read-out gate region 16, and a p-type channel stop region 17 are formed (ST3).

Figure 5C:
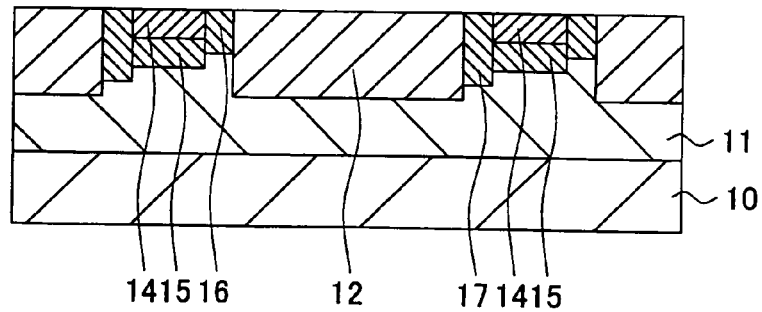

Next, as shown in FIG. 5C, by the ion implantation method, an n-type signal charge accumulation region 12 is formed in the region forming the light receiving portion of the substrate 10 (ST4).

Figure 6A:
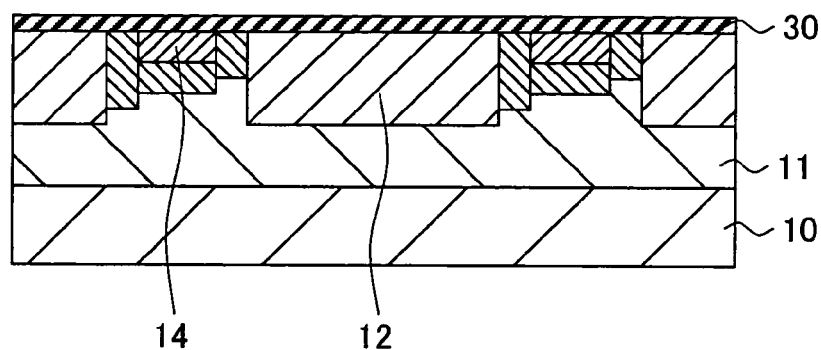
FIGS. 6A and 6B are sectional views of steps in the production of a solid state imaging device according to an embodiment of the present invention.

Next, as shown in FIG. 6A, a gate insulation film 30 made of a silicon oxide film is formed on the substrate 10 by thermal oxidation (ST5). Note that, as the gate insulation film 30, a multilayer film of a silicon oxide film, silicon nitride film, and silicon oxide film may be formed.

Figure 6B:
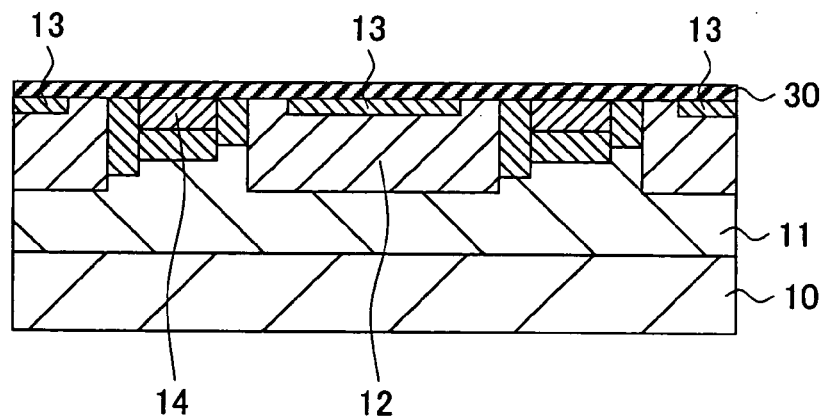

Next, as shown in FIG. 6B, by the ion implantation method, a p-type positive hole accumulation region 13 is formed in the surface layer portion of the signal charge accumulation region 12 formed in the substrate 10 (ST6). Then, although not shown, ion implantation for forming the reset drain RD and the floating diffusion FD of the transistor (Tr) 4a is carried out (ST7).

Figure 7A:
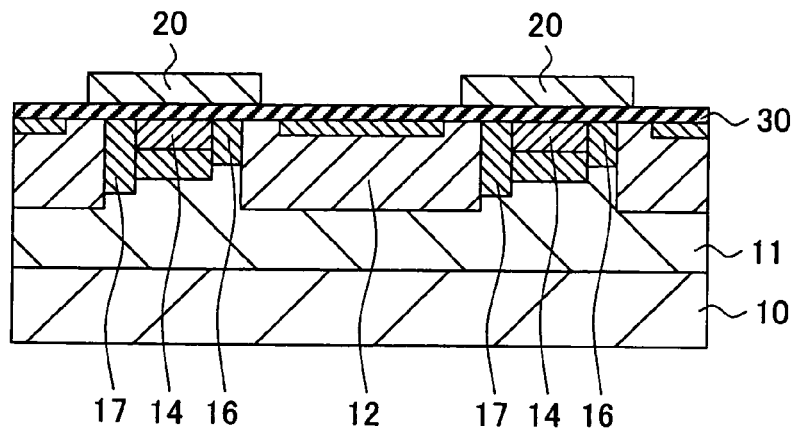
FIGS. 7A and 7B are sectional views of steps in the production of a solid state imaging device according to an embodiment of the present invention.

Next, as shown in FIG. 7A, a transfer electrode 20 is formed on the substrate 10 via the gate insulation film 30 (ST8). A transfer electrode 20 having a single-layer structure is formed, for example, by depositing a polycrystalline silicon layer on the substrate 10 and processing the polycrystalline silicon layer by photolithography or etching. The thickness of the polycrystalline silicon layer is 200 nm to 500 nm. Due to this, a transfer electrode 20 configured by the first transfer electrode 21 and the second transfer electrode 22 is formed. The pattern of the transfer electrode 20 is as shown in FIG. 2.

Figure 7B:
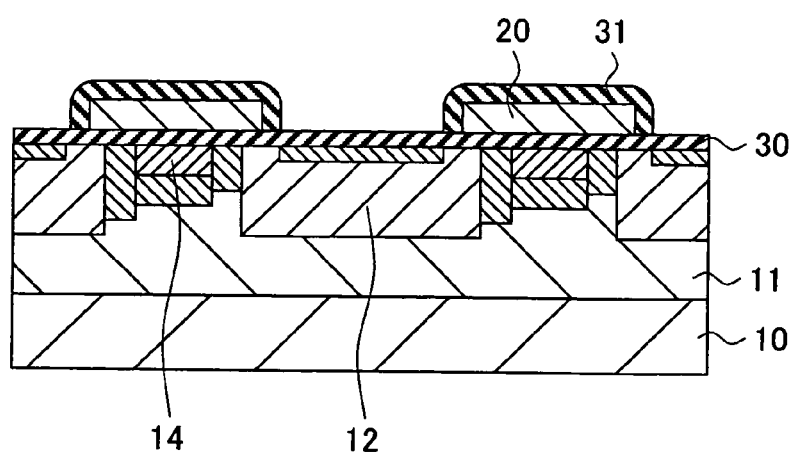

Next, as shown in FIG. 7B, an insulation film 31 is formed so as to cover the transfer electrode 20 (ST9). The insulation film 31 is formed by depositing a silicon oxide film by, for example, the CVD process. The thickness of the insulation film 31 is set at approximately 100 nm so as to enable endurance against a drive voltage of 10-odd volts.

Figure 8A:
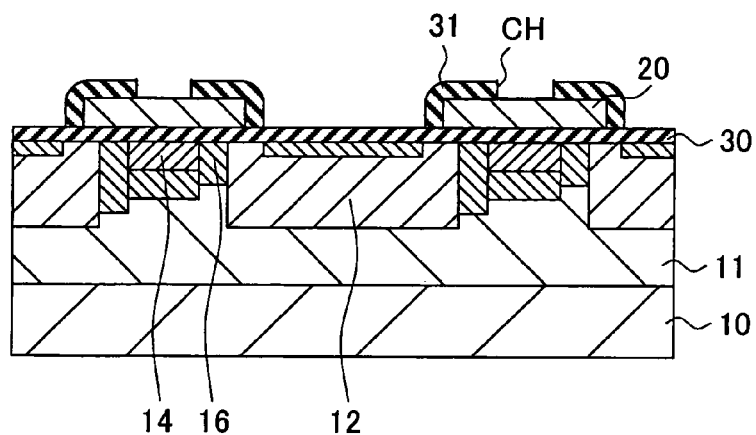
FIGS. 8A and 8B are sectional views of steps in the production of a solid state imaging device according to an embodiment of the present invention.

Next, as shown in FIG. 8A, by photolithography and etching, a contact hole CH is formed in the insulation film 31 on the first transfer electrode 21.

Figure 8B:
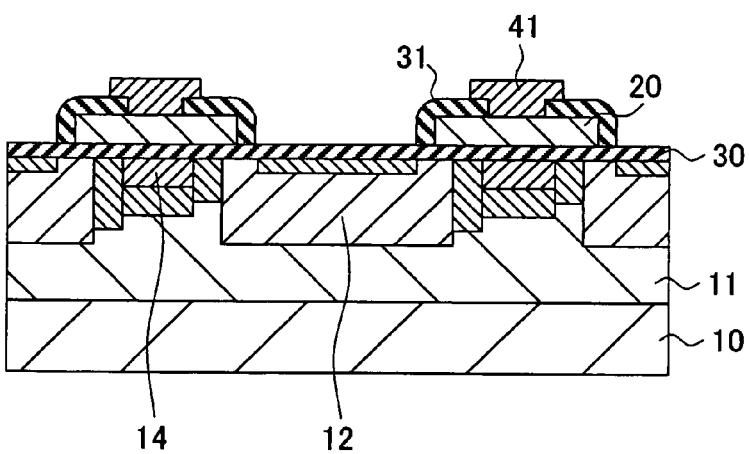

Next, as shown in FIG. 8B, by depositing a polycrystalline silicon layer on the entire surface and processing the polycrystalline silicon layer by photolithography and etching, a first drive interconnect 41 is formed. The first drive interconnect 41 is connected to the first transfer electrode 21 via the contact hole CH. The thickness of the polycrystalline silicon layer is 200 to 500 nm.

Figure 9A:
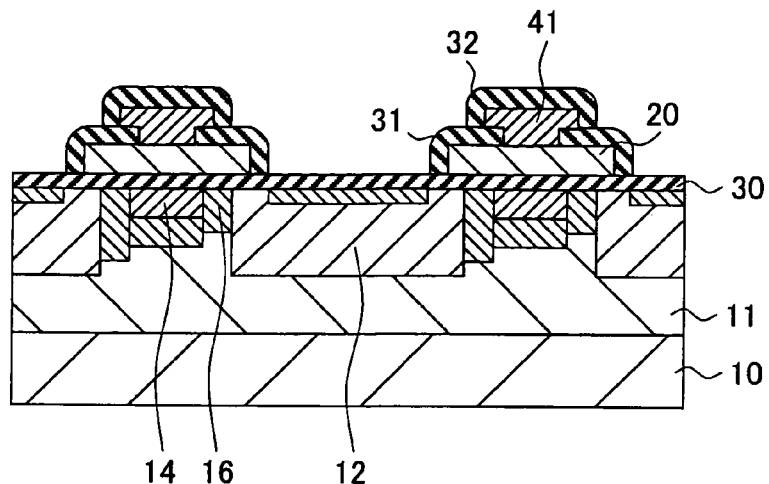
FIGS. 9A and 9B are sectional views of steps in the production of a solid state imaging device according to an embodiment of the present invention.

Next, as shown in FIG. 9A, an insulation film 32 covering the first drive interconnect 41 is formed. The insulation film 32 is formed by depositing a silicon oxide film by, for example, the CVD process. The thickness of the insulation film 32 is set at approximately 100 nm so as to be able to endure a drive voltage of 10-odd volts.

Figure 9B:
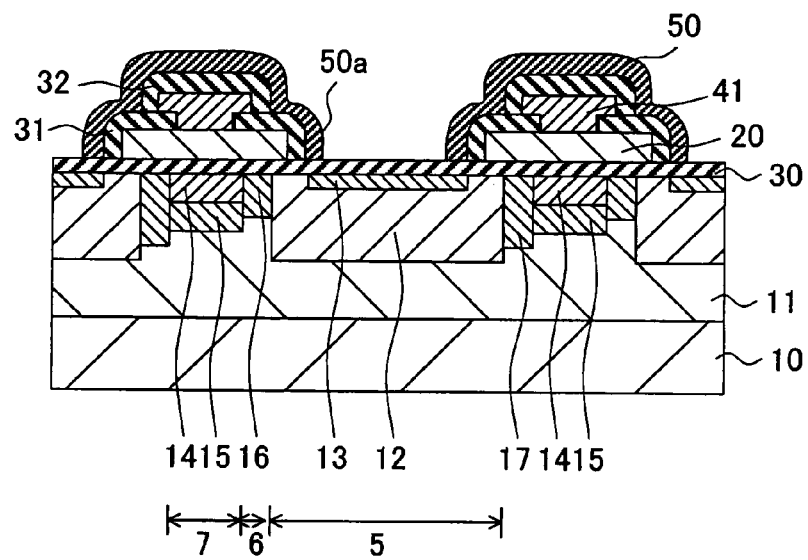

Next, as shown in FIG. 9B, a light shielding film 50 having an opening portion 50a at the location of the light receiving portion 5 and covering the transfer electrode 20 and the first drive interconnect 41 is formed (ST10). The light shielding film 50 is formed, for example, by depositing a high melting point metal film such as tungsten on the entire surface and processing the high melting point metal film by dry etching using a resist mask.

Figure 10A:
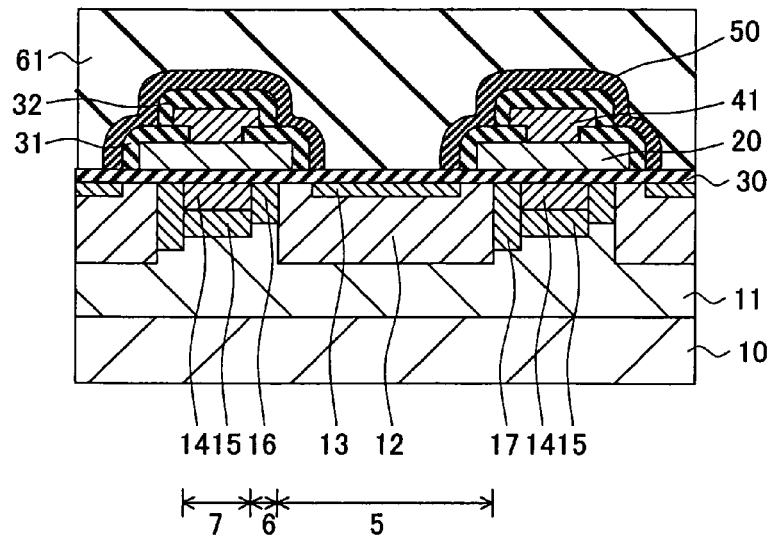
FIGS. 10A and 10B are sectional views of steps in the production of a solid state imaging device according to an embodiment of the present invention.

Next, as shown in FIG. 10A, on the substrate 10, for example, BPSG is deposited and reflow treatment is carried out to thereby form the inter-layer insulation film 61 (ST11). Then, although not shown, in the inter-layer insulation film 61, a contact hole for connection to the floating diffusion FD and the reset drain RD of the transistor 4a of the output portion 4 is formed. Thereafter, an interconnect is formed on the inter-layer insulation film 61 (ST12).

Figure 10B:
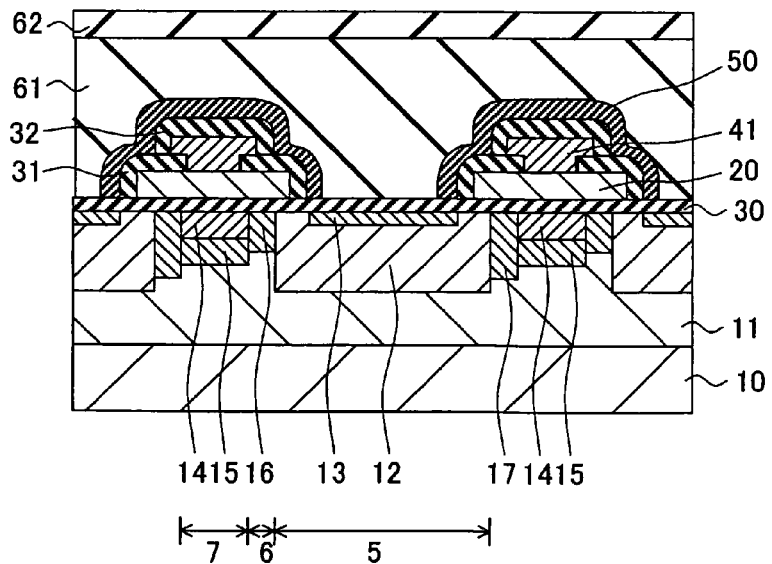

Next, as shown in FIG. 10B, a silicon nitride film is deposited on the inter-layer insulation film 61 by plasma CVD process, then the surface of the silicon nitride film is flattening to thereby form a passivation film 62 (ST13).

Figure 11A:
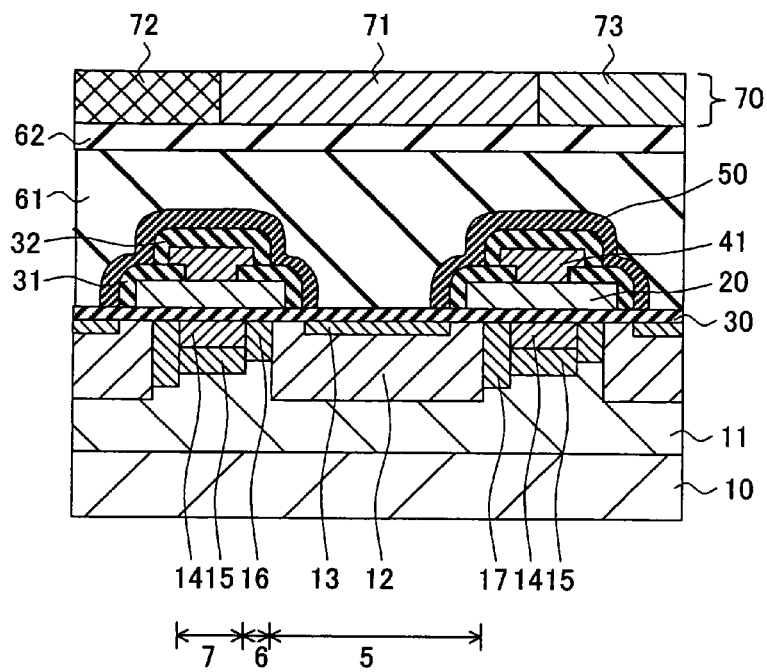
FIGS. 11A and 11B are sectional views of steps in the production of a solid state imaging device according to an embodiment of the present invention.
Figure 11B:
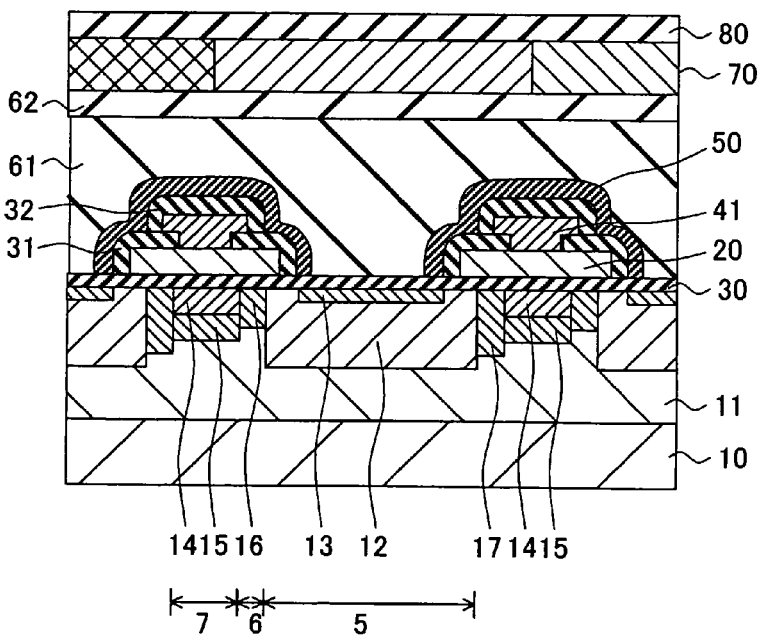
Figure 12:
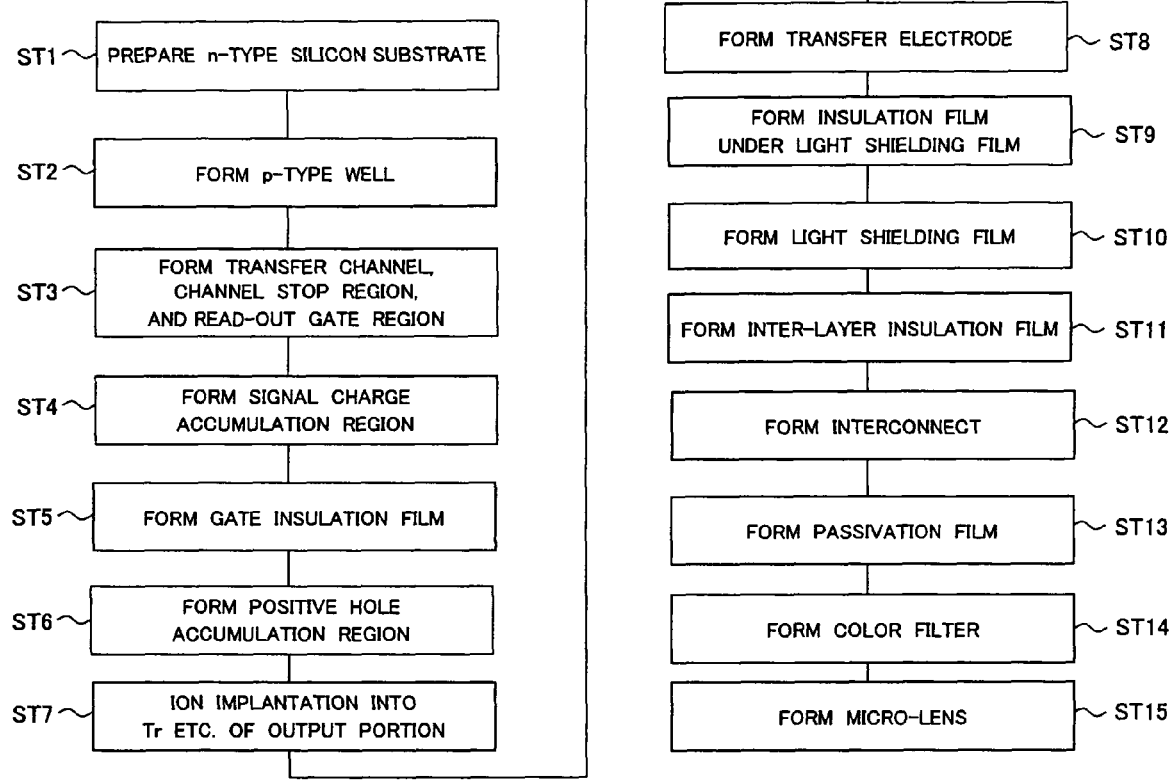
FIG. 12 is a flow chart showing a method of producing a solid state imaging device according to an embodiment of the present invention.

Next, as shown in FIG. 11A, a color filter 70 is formed on the passivation film 62 (ST14). The color filter 70 is formed by using, for example, a color resist method. For example, by forming a green color resist on the passivation film 62 and then exposing and developing the green color resist, the pattern of the green color filter 71 is formed. By forming, exposing, and developing color resists in the same way, a blue color filter 72 and a red color filter 73 are formed. Note that the sequence of formation of the color filter 70 is not limited.

Next, as shown in FIG. 1B, in order to flatten the surface relief shapes of the color filter 70, a transparent flattening film 80 is formed on the color filter 70. As the flattening film 80, for example, an acrylic thermoplastic resin is used.

Next, a micro-lens 90 is formed on the flattening film 80 (refer FIG. 3, ST15). For example, by coating a lens material, then forming a resist mask having a lens shape and etching under condition giving an etching selection ratio of the resist mask and the lens material of 1, a micro-lens 90 is formed.

A solid state imaging device according to the first embodiment is produced as explained above. As explained with reference to the sectional views of the steps of FIGS. 5A to 5C to FIGS. 11A and 11B and the process flow chart of FIG. 12, in the first embodiment, all of the positive hole accumulation regions 13 are formed before processing the transfer electrodes 20.

Figure 13:
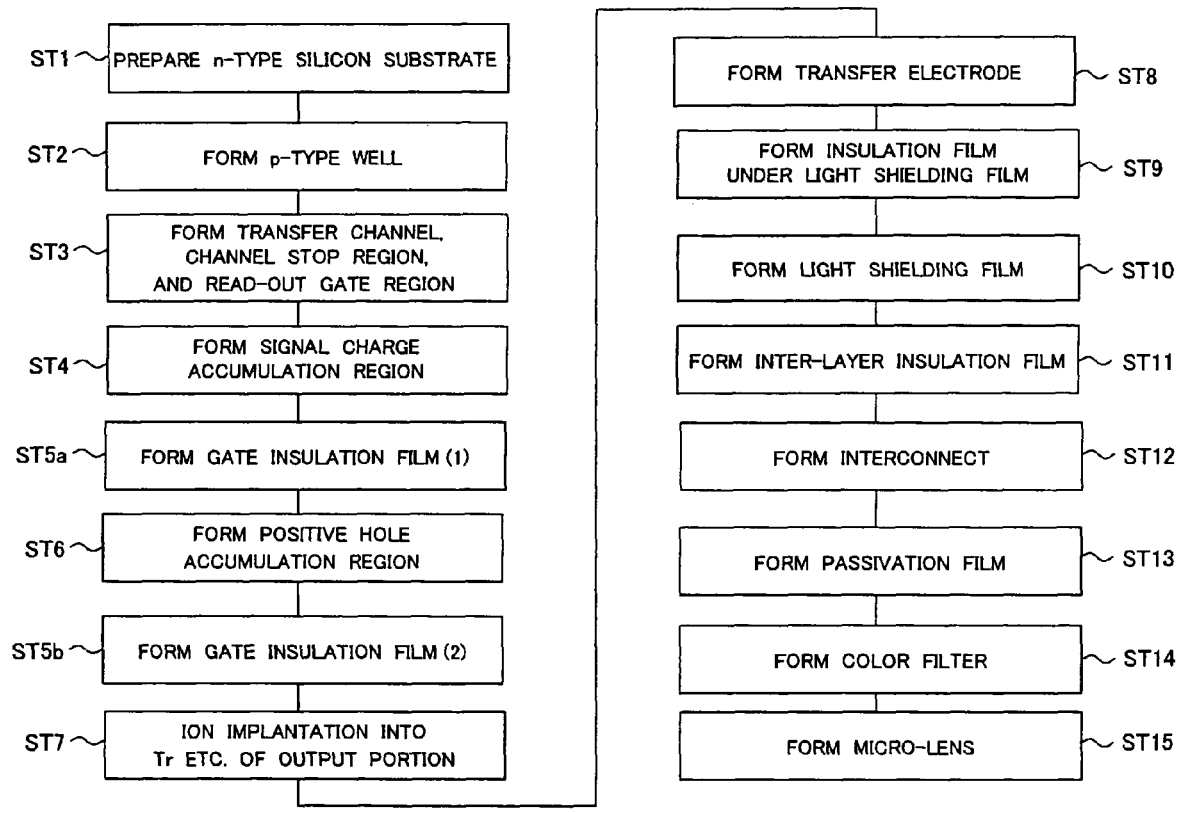
FIG. 13 is a flow chart showing a modification of the method of producing a solid state imaging device according to an embodiment of the present invention.

FIG. 13 shows a modification of the method of producing a solid state imaging device according to the first embodiment. As shown in FIG. 13, when a gate insulation film 30, made of, for example, a multilayer film of a silicon oxide film, silicon nitride film, and silicon oxide film, is employed, the insulation film forming the gate insulation film 30 may be formed before or after the formation of the positive hole accumulation region 13. For example, the silicon oxide film of the first layer is formed by thermal oxidation (ST5a), then positive hole accumulation region 13 is formed (ST6), then the silicon nitride film and the silicon oxide film are formed (ST5b). A shallow positive hole accumulation region 13 can be maintained unless the thermal oxidation step is carried out in the step of formation of the silicon nitride film and the silicon oxide film after forming the positive hole accumulation region 13.

The above solid state imaging device may be used in a camera, for example, video camera, digital still camera, or electronic endoscope camera.

Figure 29:
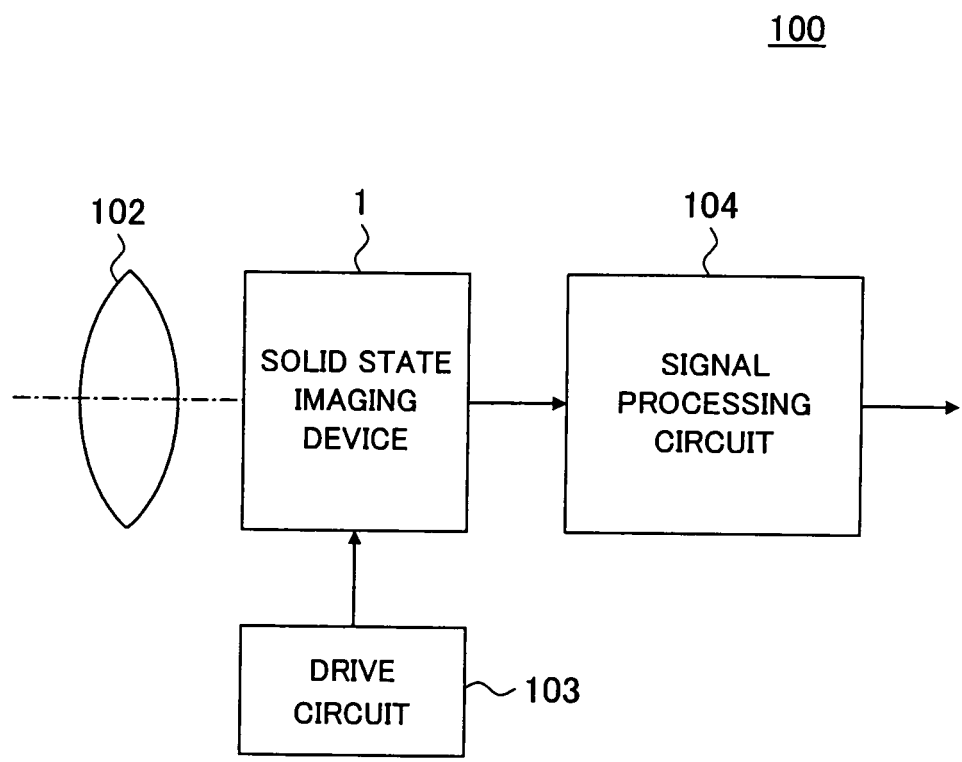
FIG. 29 is a block diagram showing the schematic configuration of a camera to which the solid state imaging device according to the present embodiment is applied.

FIG. 29 is a schematic view of the configuration of a camera in which the above solid state imaging device is used.

A camera 100 has the above solid state imaging device 1, an optical system 102, a drive circuit 103, and a signal processing circuit 104.

The optical system 102 focuses the image light (incident light) from the object onto the imaging surface of the solid state imaging device 1. Due to this, the light receiving portions 5 of the solid state imaging device 1 convert the incident light to signal charges in accordance with the incident light amount and accumulate the signal charges in the signal charge accumulation region 12 of the light receiving portions 5 for a constant period.

The drive circuit 103 gives various types of timing signals such as transfer pulses $\phi V1$, $\phi V2$, $\phi V3$, and $\phi V4$ of four phases and transfer pulses $\phi H1$ and $\phi H2$ of two phases mentioned above to the solid state imaging device 1. Due to this, various types of drive such as reading, vertical transfer, and horizontal transfer of signal charges of the solid state imaging device 1 are carried out. Further, by this drive, analog image signals are output from the output portion 4 of the solid state imaging device 1.

The signal processing circuit 104 performs various types of signal processing such as noise elimination and conversion to digital signals with respect to the analog image signals output from the solid state imaging device 1. After the signal processing by the signal processing circuit 104, these are stored in a memory or other storage medium.

Figure 14A:
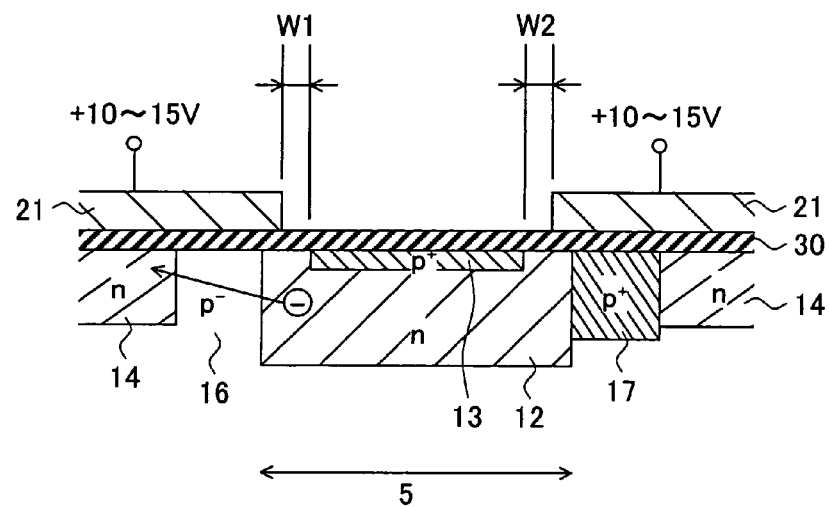
FIGS. 14A and 14B are views for explaining effects of the solid state imaging device according to an embodiment of the present invention.
Figure 14B:
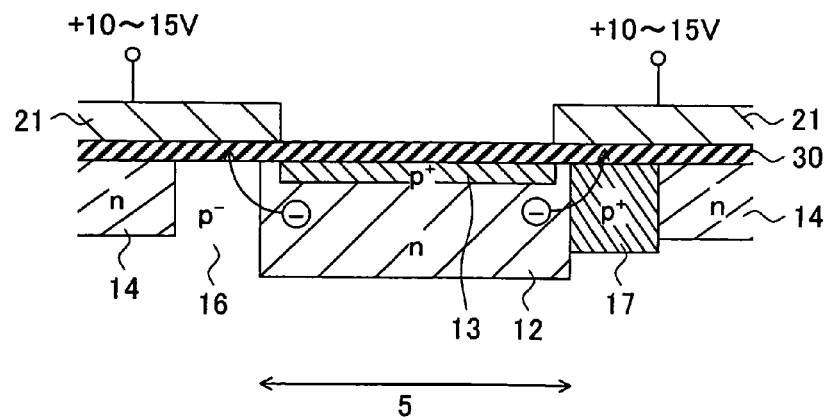

Next, there are described effects of the solid state imaging device according to the first embodiment, a method of producing the same and a camera, with reference to FIGS. 14A and 14B. FIG. 14A is a sectional view of the vicinity of a light receiving portion 5 of the solid state imaging device according to the first embodiment, and FIG. 14B is a sectional view of a comparative example in which the positive hole accumulation region 13 is formed by self alignment with respect to a transfer electrode 20.

In the first embodiment, as shown in FIG. 14A, a $p^+$-positive hole accumulation region 13 is arranged at a distance in the horizontal direction from a first transfer electrode 21. The offset amount of the positive hole accumulation region 13 with respect to the first transfer electrode 21 on the read-out side is defined as W1, and the offset amount of the positive hole accumulation region 13 with respect to the first transfer electrode 21 on the opposite side to the read-out side is defined as W2.

As shown in FIG. 14B, when the $p^+$-type positive hole accumulation region 13 is formed just under the end of the first transfer electrode 21, a sharp pn junction is formed just under the end of the first transfer electrode 21, and an extremely large field is generated at the time of the application of the read-out voltage Vt (+10 to 15 V) to the first transfer electrode 21. For this reason, at the time of reading, signal charges (electrons) accumulated in the signal charge accumulation region 12 are accelerated in the high field and become hot electrons having a high energy. The hot, high energy electrons, therefore, overcome the energy barrier of the gate insulation film 30 and are trapped in the gate insulation film 30. Even when the hot electrons do not have enough energy to overcome the energy barrier of the gate insulation film 30, due to a band-to-band tunneling effect and a trap assisted band-to-band tunneling effect by a ferro-electric field, the probability of injection of electrons into the gate insulation film 30 becomes high.

When electrons are injected into the gate insulation film 30, they shift to a direction whereby the threshold value becomes large. For this reason, even when the same read-out voltage is applied, read-out failure occurs such that signal charges (electrons) accumulated in the signal charge accumulation region 12 are not able to be completely read out.

Contrary to this, in the first embodiment, as shown in FIG. 14A, the positive hole accumulation region 13 is arranged spaced from the first transfer electrode 21 to which the read-out voltage is applied by exactly the distance of the offset amounts W1 and W2. For this reason, there is no sharp pn junction just under the end of the first transfer electrode 21, therefore the field concentration can be reduced. Since the field concentration can be reduced, the injection of electrons into the gate insulation film 30 is suppressed, and the threshold value will not shift. For this reason, a solid state imaging device having little aging and high stability can be realized.

Further, a positive hole accumulation region 13 is formed while overlapping the second transfer electrode 22 in the vertical direction (refer FIG. 4). The channel stop region 17 is formed under the second transfer electrode 22 between the light receiving portions 5 lined up in the vertical direction, and the positive hole accumulation region 13 and the channel stop region 17 are linked under the second transfer electrode 22.

A positive hole in an electron positive hole pair generated in the opto-electric conversion step in the light receiving portion 5 can escape to the outside by passing through the positive hole accumulation region 13 and passing through the channel stop region 17. Due to this, the potential of the positive hole accumulation region 13 can be maintained constant.

By optimizing the location of the positive hole accumulation region 13 with respect to the transfer electrode 20 as in the above way, a solid state imaging device improved and stabilized in the imaging characteristics can be realized. According to a camera provided with the solid state imaging device according to the first embodiment, a camera improved and stabilized in the imaging characteristics can be realized.

In the method of producing a solid state imaging device according to the first embodiment, in order to optimize the location of the positive hole accumulation regions 13 with respect to the transfer electrodes 20, all of the positive hole accumulation regions 13 are formed before the transfer electrode 20.

In the prior art forming the positive hole accumulation regions 13 by ion implantation using the transfer electrodes 20 as masks, it is necessary to perform the ion implantation with a low energy in order to form the positive hole accumulation regions 13 in only the surface layer portions. For this reason, a step of removing the gate insulation films 30 formed on the light receiving portions 5 becomes necessary. In the first embodiment, the step of removing the gate insulation films 30 on the light receiving portions 5 becomes unnecessary, therefore a solid state imaging device simplified in steps and lower in costs can be produced.

Further, when the signal charge accumulation regions 12 and the positive hole accumulation regions 13 are formed after forming the transfer electrodes 20, in the ion implantation step, oxygen and nitrogen in the insulation films 31 of the edge portions of the transfer electrodes 20 are injected into the substrate 10 together with injected atoms. This is referred to as "knock-on implantation" or "recoil implantation". When such atoms are injected into the substrate 10, defects are formed in the substrate 10, minority carriers (electrons) are thermally generated during the light receiving period by the defects, and the noise component (dark current) increases. In particular, portions near the boundaries between the signal charge accumulation regions 12 and the positive hole accumulation regions 13 under the ends of the transfer electrodes 20 have a strong fields, therefore minority carriers are apt to be thermally generated.

In the first embodiment, since the signal charge accumulation regions 12 and the positive hole accumulation regions 13 are formed before forming the transfer electrodes 20, a solid state imaging device able to suppress the knock-on implantation described above and having little dark current can be produced.

The present invention is not limited to the explanation of the first embodiment described above.

The present invention can also be applied to, other than the interline-transfer type, a solid state imaging device of frame transfer type and a frame interline-transfer type. Further, the structure of the transfer electrode 20 is not particularly limited. The transfer electrode may have a single-layer structure, a two-layer, or three-layer structure. Further, the first drive interconnect 41 may not exist. Further, the solid state imaging device according to an embodiment of the present invention can be applied to not only a CCD type, but also a MOS type solid state imaging device.

Other than this, various modifications are possible within a range not out of the gist of the present invention.

Below, there is described a second embodiment of the present invention, with reference to the drawings. In the drawings, the same notations are attached to the same components. In the second embodiment, the explanation will be given of an example of applying the present invention to an interline-transfer type CCD type solid state imaging device. Note that, the transfer method is not particularly limited.

Figure 15:
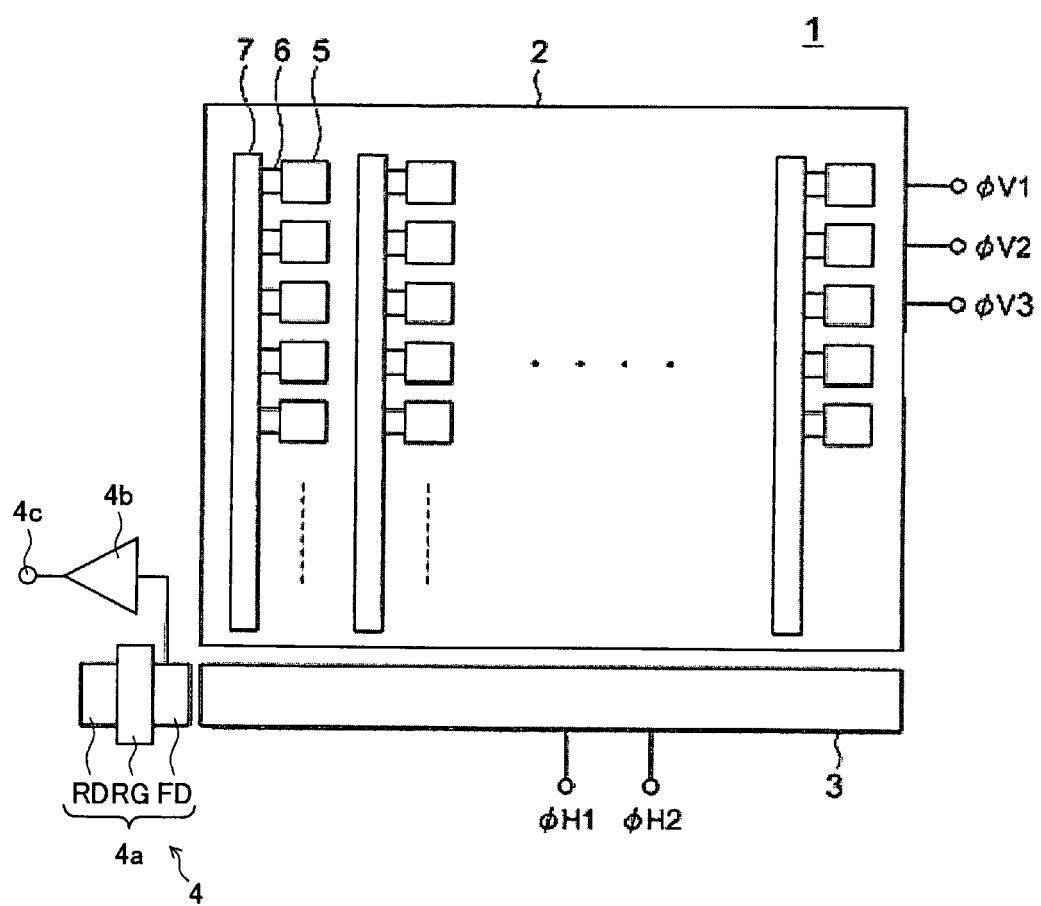
FIG. 15 is a schematic view of the configuration of an example of a solid state imaging device according to an embodiment of the present invention.

FIG. 15 is a schematic view of the configuration of a solid state imaging device according to the second embodiment. The solid state imaging device 1 according to the second embodiment has an imaging portion 2, a horizontal transfer portion 3, and an output portion 4.

The imaging portion 2 has a plurality of light receiving portions 5 arranged in a matrix for each pixel, a plurality of vertical transfer portions 7 arranged for each vertical row of the light receiving portions 5, and read-out gate portions 6 arranged between the light receiving portions 5 and the vertical transfer portions 7.

The light receiving portions 5 are made by, for example, photodiodes which opto-electrically convert image light (incident light) incident from an object to be imaged to signal charges of amounts in accordance with the light amounts and store the same. The read-out gate portions 6 read out the signal charges accumulated in the light receiving portions 5 to the vertical transfer portions 7.

The vertical transfer portions 7 are driven by, for example, transfer pulses φV1, φV2, and φV3 of three phases that transfer the signal charges read out from the light receiving portions 5 in the vertical direction (downward direction in the figure). Note that, the transfer pulses are not limited to three phases. The transfer pulses φV1 to φV3 are, for example, 0V or −7V.

The horizontal transfer portion 3 is driven by the transfer pulses φH1 and φH2 of two phases and transfers the signal charges vertically transferred from the vertical transfer portions 7 in a horizontal direction (leftward direction in the figure).

The vertical transfer portions 7 and the horizontal transfer portion 3 have transfer channels formed in the substrate and extend in the transfer direction and a plurality of transfer electrodes formed lined up in the transfer direction in a state where insulation films are interposed on the transfer channels.

The output portion 4 converts the signal charges horizontally transferred by the horizontal transfer portion 3 to electric signals and outputs the same. The output portion 4 is configured by, for example, a floating diffusion amplifier. The output portion 4 has a transistor 4a formed by a floating diffusion FD, a reset gate RG, and a reset drain RD, an amplifier 4b, and an output terminal 4c.

The voltage of the floating diffusion FD changes in accordance with the amount of signal charges horizontally transferred by the horizontal transfer portion. The voltage of the floating diffusion FD is amplified by the amplifier 4b and extracted as an analog signal by the output terminal 4c. Thereafter, the reset pulse is input to the reset gate RG, the transistor 4a becomes the ON state, and the signal charges of the floating diffusion FD are swept away to the reset drain RD. Note that a power supply voltage Vdd is applied to the reset drain RD.

Figure 16:
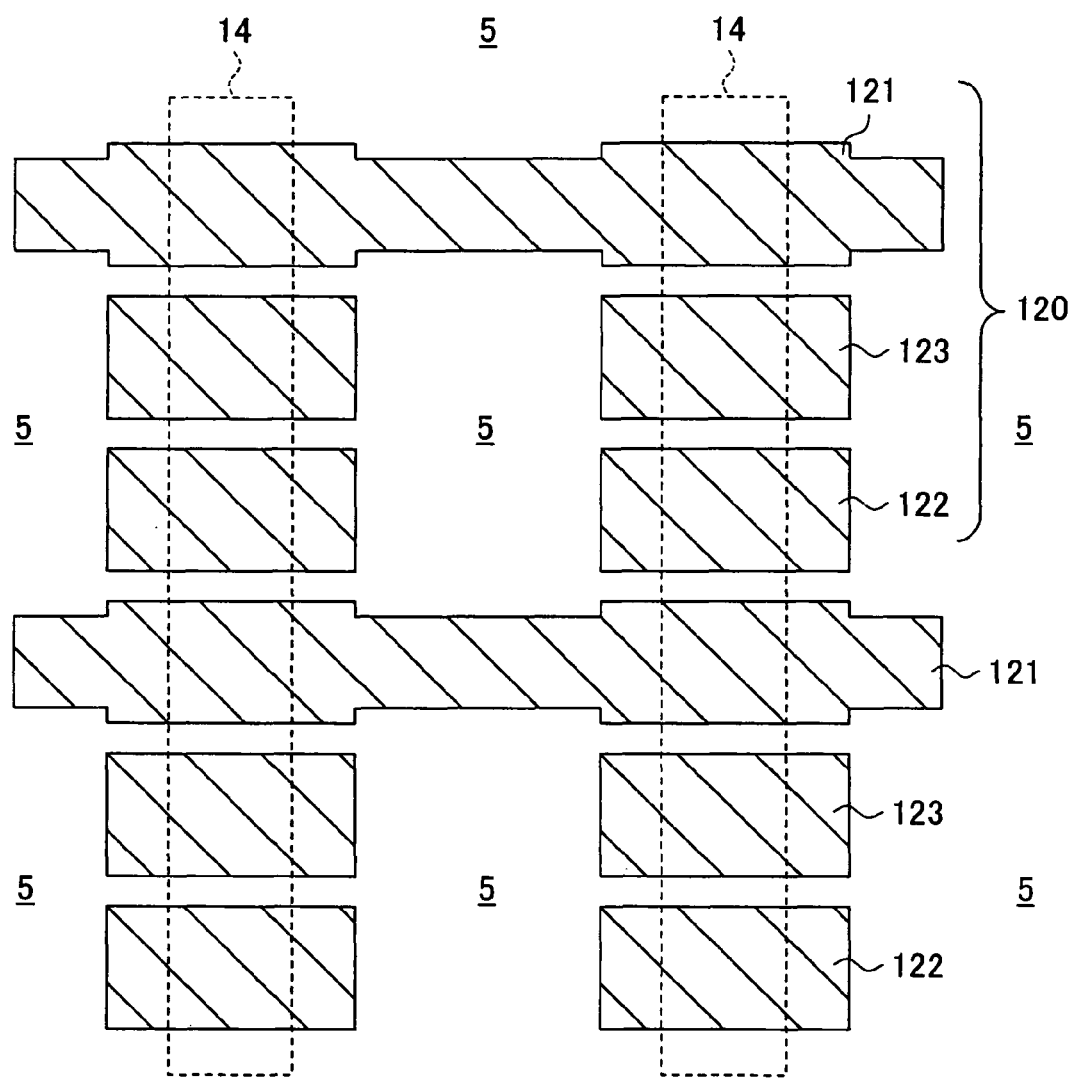
FIG. 16 is a plan view showing the transfer electrodes.

FIG. 16 is a plan view of the elementary portions in the imaging portion 2. In FIG. 16, only the transfer electrodes are illustrated.

The light receiving portions 5 are arranged in the horizontal direction and the vertical direction. The horizontal direction (lateral direction) is the column direction, and the vertical direction is the row direction. The transfer channels 14 extend in the vertical direction between two light receiving portions 5 lined up in the horizontal direction. In this way, the transfer channels 14 extend in the transfer direction adjacent to the row of the light receiving portions 5.

On each transfer channel 14, a first transfer electrode 121, a third transfer electrode 123, and a second transfer electrode 122 are repeatedly arranged in the transfer direction in a state where the insulation films are interposed. The first transfer electrode 121, the second transfer electrode 122, and the third transfer electrode 123, may be simply referred to as the "transfer electrodes 120". The vertical transfer portions 7 are formed by the transfer channels 14 and the transfer electrodes 120. The transfer electrodes 120 have single-layer structures, for example, are formed by single layers of polycrystalline silicon. In the second embodiment, three transfer electrodes are arranged for each light receiving portion 5.

The first transfer electrode 121 is formed so as to extend in the horizontal direction while passing between light receiving portions 5 adjacent in the vertical direction. The first transfer electrodes 121 are arranged crossing the transfer channel 14 and are formed so as to become broader in the vertical direction on the transfer channel 14.

The second transfer electrode 122 is arranged adjacent to a light receiving portion 5. The second transfer electrodes 122 adjacent in the horizontal direction form mutually isolated shapes.

The third transfer electrode 123 is arranged adjacent to a light receiving portion 5. The third transfer electrodes 123 adjacent in the horizontal direction form mutually isolated shapes.

Figure 17:
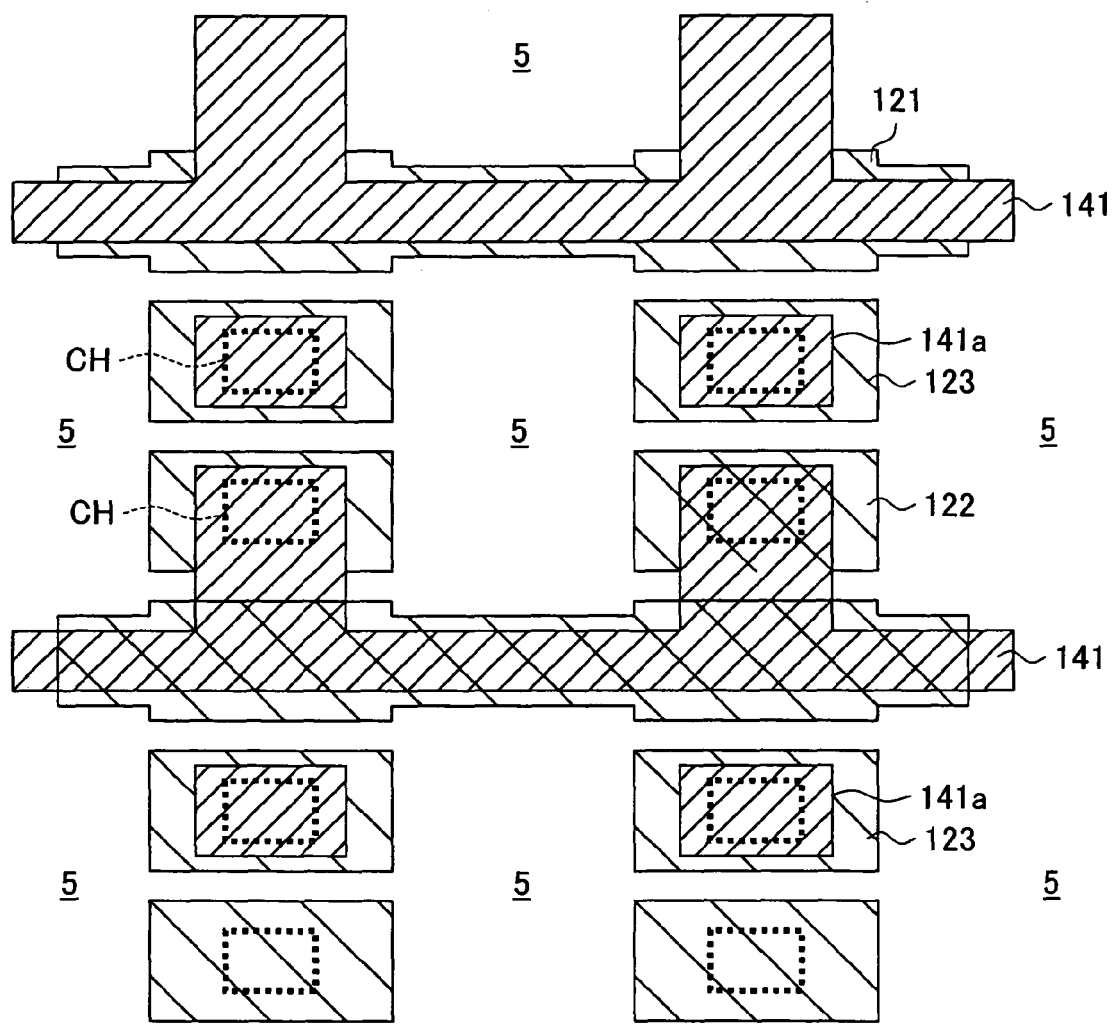
FIG. 17 is a plan view showing the transfer electrodes and first drive interconnects.

A first drive interconnect is formed over the above transfer electrodes 20 via insulation films. FIG. 17 is a plan view showing the layout of a first drive interconnect 141.

On the first transfer electrodes 121, a first drive interconnect 141 extending in the horizontal direction is formed via the insulation film. The first drive interconnect 141 is arranged so as to be superimposed on the first transfer electrodes 121 at the inter-pixel portions. The first drive interconnect 141 extends in the vertical direction on the transfer channel 14 and is connected to the second transfer electrodes 122 via the contact holes CH. At the inter-pixel portions, the width of the first drive interconnect 141 in the vertical direction is narrower than the width of the first transfer electrode 121 in the vertical direction at the inter-pixel portions. On the transfer channel 14, the width of the first drive interconnect 141 in the horizontal direction is narrower than the width of the transfer electrodes 120 in the horizontal direction.

In the present embodiment, a buffer layer 141a is formed on the third transfer electrodes 123 via insulation films. The buffer layer 141a is provided at the same layer as that of the first drive interconnect 141. Note that the buffer layer 141a may not be provided on the third transfer electrodes 123.

The first drive interconnect 141 and the buffer layer 141a are formed by polycrystalline silicon, tungsten or another metal material, or a silicide-based material. When using a metal material for the first drive interconnects 141, an equivalent resistance value is obtained even if making the thickness and width smaller in comparison with the case of using polycrystalline silicon, therefore there is the advantage that step differences formed at the peripheral edges of the light receiving portions 5 can be reduced.

Figure 18:
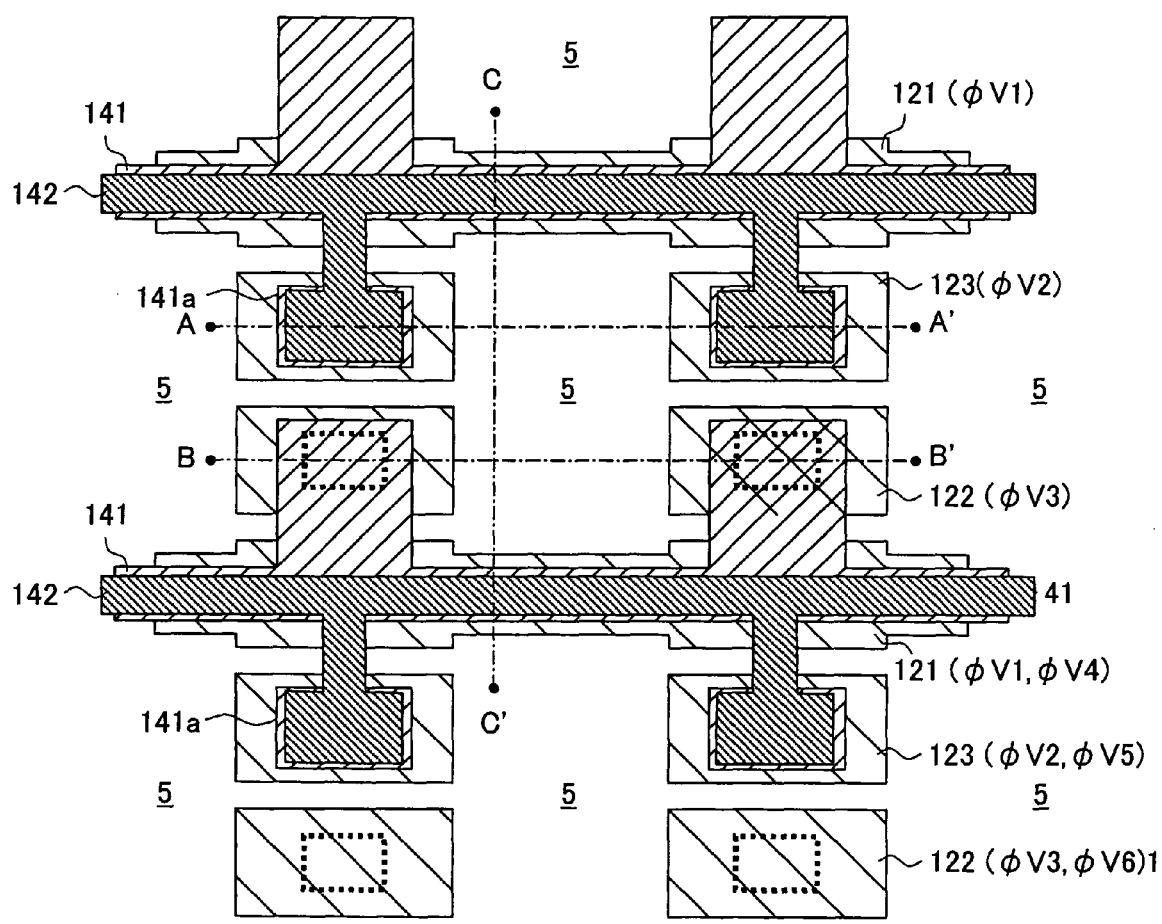
FIG. 18 is a plan view showing the transfer electrodes and first to second drive interconnects.

The second drive interconnect is formed at a layer above the first drive interconnect 141. FIG. 18 is a plan view showing the layout of a second drive interconnect 142.

On the first drive interconnect 141, a second drive interconnect 142 extending in the horizontal direction is formed via an insulation film. The second drive interconnect 142 is arranged so as to overlap the first drive interconnect 141 in the inter-pixel portion. The second drive interconnect 142 extends in the vertical direction on the transfer channel 14 and is connected to the third transfer electrodes 123 via the contact holes. In the inter-pixel portion of the vertical direction, the width of the second drive interconnect 142 in the vertical direction is set equivalent to or less than the width of the first drive interconnect 141 and narrower than the width of the first transfer electrode 121 in the vertical direction in the inter-pixel portion. On the transfer channel 14, the width of the second drive interconnect 142 in the horizontal direction is narrower than the width of the transfer electrode 120 in the horizontal direction.

The second drive interconnect 142 is formed by polycrystalline silicon, tungsten or another metal material, or a silicide-based material. When using a metal material for the second drive interconnects 142, an equivalent resistance value is obtained even if making the thickness and width smaller in comparison with the case of using polycrystalline silicon, therefore there is the advantage that step differences, formed at the peripheral edges of the light receiving portions 5, can be reduced.

In the second embodiment, the second drive interconnects 142 and the third transfer electrodes 123 are connected via a buffer layer 141a. Note that, when employing a metal material such as tungsten as the second drive interconnects 142, preferably the buffer layer 141a is provided on the third transfer electrodes 123. This is provided in order to suppress the influence of diffusion of the tungsten or other metal material into the polycrystalline silicon upon the transfer. Further, by providing the buffer layer 141a on the third transfer electrodes 123, there also exists the advantage that the aspect ratio of contact holes becomes smaller.

In the above solid state imaging device, three transfer electrodes are provided with respect to one light receiving portion 5, therefore full pixel reading becomes possible. In the above solid state imaging device, three-phase drive, six-phase drive, and nine-phase drive become possible.

In the case where, for example, three-phase drive is carried out, the transfer pulse φV1 is applied to the first transfer electrode 121, φV2 is applied to the third transfer electrode 123, and φV3 is applied to the second transfer electrode 122. In this case, the read-out voltage is applied to one or both of the second transfer electrode 122 and the third transfer electrode 123.

When six-phase drive is carried out, φV1 to φV6 are sequentially applied to the first transfer electrode 121, the third transfer electrode 123, and the second transfer electrode 122 aligned in the vertical direction. In this case, the read-out voltage is applied to one or both of the second transfer electrode 122 and the third transfer electrode 123.

In the second embodiment, all second transfer electrodes 122 in the horizontal direction are connected by the first drive interconnect 141, and all third transfer electrodes 123 in the horizontal direction are connected by the second drive interconnect 142.

For this reason, other than full pixel reading (progressive scan), field reading (field integration) and frame reading (frame integration) become possible. For example, frame reading for reading only signal charges of pixels (light receiving portions) in columns having odd numbers in a first field and reading signal charges of pixels (light receiving portions) in columns having even numbers in a second field becomes possible. Further, field reading becomes possible.

Figure 19:
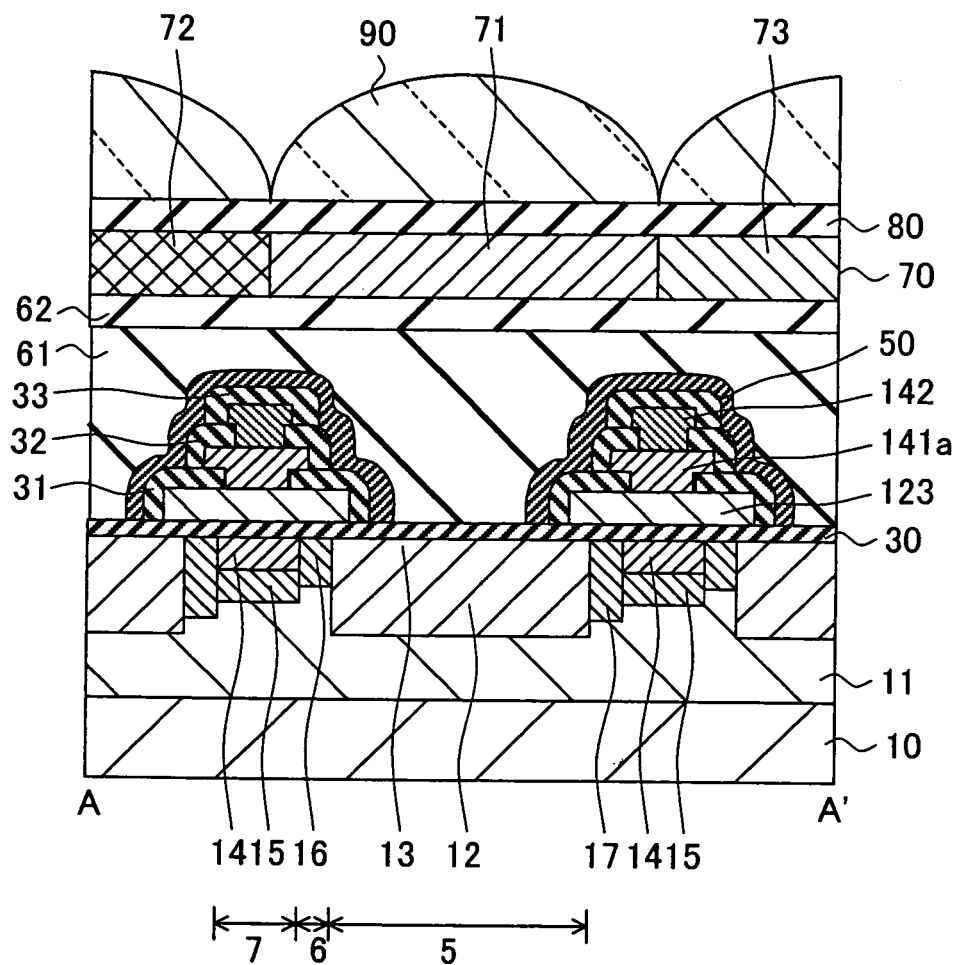
FIG. 19 is a sectional view taken along the line A-A' in FIG. 18.
Figure 20:
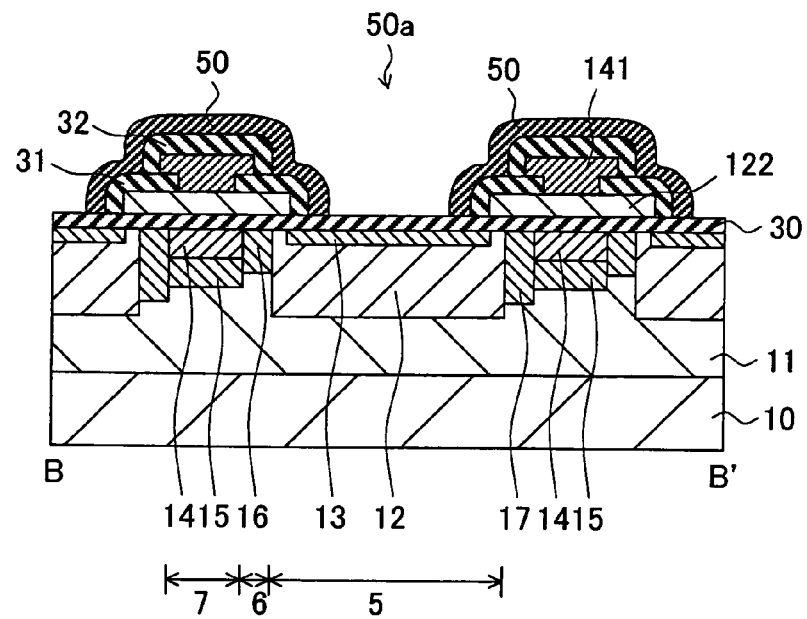
FIG. 20 is a sectional view taken along the line B-B' in FIG. 18.
Figure 21:
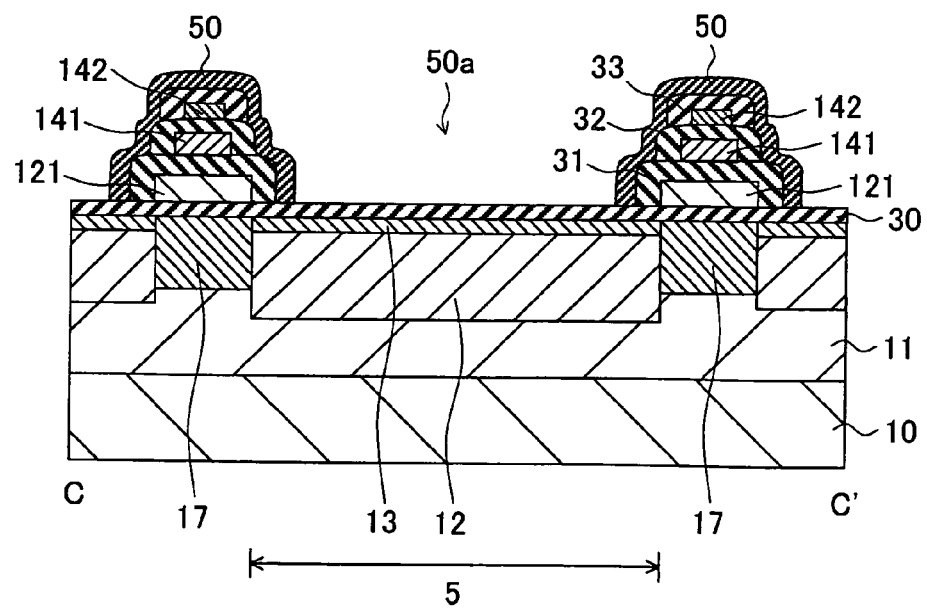
FIG. 21 is a sectional view taken along the line C-C' in FIG. 18.

FIG. 19 is a sectional view taken along a line A-A' in FIG. 4. FIG. 20 is a sectional view taken along a line B-B' in FIG. 18. FIG. 21 is a sectional view taken along a line C-C' in FIG. 4. Note that the upper layer of the light shielding film is illustrated in only FIG. 19 for simplification of the illustration.

For example, a p-type well 11 is formed in an n-type silicon substrate (hereinafter referred to as the "substrate 10"). The p-type well 11 forms an overflow barrier.

Each light receiving portion 5 has an n-type signal charge accumulation region 12 formed in the p-type well 11 and a p$^+$-type positive hole accumulation region 13 formed in the surface layer of the signal charge accumulation region 12. The positive hole accumulation region 13 is provided in order to suppress the dark current which is generated near the surface of the signal charge accumulation region 12 and becomes a noise source.

In each light receiving portion 5, an npn structure is formed by the signal charge accumulation region 12, the p-type well 11, and the substrate 10. This npn structure forms a vertical type overflow drain structure discharging signal charges to the substrate 10 side when the signal charges, excessively generated due to the strong light incident upon the light receiving portions 5, overcome the overflow barrier formed by the p-type well 11.

Further, each light receiving portion 5 is provided with the function of an electronic shutter. Namely, by making the substrate potential supplied to the substrate 10 a high level (for example, +12 V), the potential barrier of the p-type well 11 is lowered and charges accumulated in the signal charge accumulation region 12 overcome the potential barrier and are swept away to the vertical direction, that is, to the substrate 10. Due to this, the exposure period can be adjusted.

Each vertical transfer portion 7 is configured by an n-type transfer channel 14, formed in the p-type well 11 at a space from the signal charge accumulation region 12 at a predetermined interval, and transfer electrodes 121 to 123, formed on the transfer channel 14 via a gate insulation film 30 made of a silicon oxide film and made of, for example, polycrystalline silicon. Under the transfer channel 14, a p-type region 15 having a relatively high concentration is formed. The p-type region 15 forms a potential barrier under the transfer channel 14. For this reason, signal charges, opto-electrically converted in a deep portion of the substrate 10, are prevented from entering into the transfer channel 14, and the occurrence of smear is suppressed.

Each read-out gate portion 6 is configured by a p-type read-out gate region 16 between the signal charge accumulation region 12 and the transfer channel 14 and transfer electrodes 122 and 123 formed on the read-out gate region 16 via the gate insulation film 30. The read-out gate region 16 forms a potential barrier between the n-type signal charge accumulation region 12 and the transfer channel 14. At the time of reading, a positive polarity read-out voltage (for example, +12 V to +15 V) is applied to the transfer electrodes 122 and 123, the potential barrier of the read-out gate region 16 is lowered, and the signal charges are read out from the signal charge accumulation region 12 to the transfer channel 14.

On the opposite side to the read-out side, with respect to the signal charge accumulation region 12, a p-type channel stop region 17 is formed. Further, the channel stop region 17 is formed in an inter-pixel portion and under the first transfer electrode 121 (refer FIG. 21). The channel stop region 17 forms a potential barrier with respect to the signal charges and prevents the inflow/outflow of signal charges.

On the transfer electrodes 121 to 123, an insulation film 31, made of, for example, silicon oxide, is formed. On the third transfer electrodes 123, a buffer layer 141a is formed via the insulation film 31 (refer FIG. 19). The third transfer electrodes 123 and the buffer layer 141a are connected via contact holes formed in the insulation film 31.

On the first transfer electrodes 121 and the second transfer electrodes 122, a first drive interconnect 141 is formed via the insulation film 31 (refer FIGS. 20 and 21). The second transfer electrodes 122 and the first drive interconnect 141 are connected via contact holes formed in the insulation film 31.

An insulation film 32, made of, for example, silicon oxide, is formed covering the first drive interconnect 141 and the buffer layer 141a. In the inter-pixel portion, the second drive interconnect 142 is formed on the first drive interconnect 141 via the insulation film 32 (refer FIG. 21).

On the buffer layer 141a, the second drive interconnect 142 is formed via the insulation film 32. The second drive interconnect 142 is made of, for example, polycrystalline silicon, tungsten or another metal material, or a silicide-based material. The buffer layer 141a and the second drive interconnect 142 are connected via the contact holes formed in the insulation film 32. Due to this, the second drive interconnect 142 and the third transfer electrodes 123 are electrically connected. When using a metal material such as tungsten as the second drive interconnect 142, a barrier metal may be interposed between the second drive interconnect 142 and the buffer layer 141a. As the barrier metal, Ti or TiW is used.

An insulation film 33, made of, for example, silicon oxide, is formed so as to cover the second drive interconnect 142. A light shielding film 50 is formed so as to cover the above transfer electrodes 121 to 123, the first drive interconnect 141, and the second drive interconnect 142. The light shielding film 50 is made of, for example, a high melting point metal such as tungsten. In the light shielding film 50, an opening 50a for allowing the light to strike the light receiving portion 5 is formed.

On the light shielding film 50, an inter-layer insulation film 61, made of, for example, borophosphosilicate glass (BPSG), is formed (refer FIG. 19). On the inter-layer insulation film 61, a passivation film 62, made of, for example, silicon nitride, is formed. The surface of the passivation film 62 is flattened.

On the passivation film 62, a color filter 70 is formed. The color filter 70 is, for example, a primary color type and has a green color filter 71, a blue color filter 72, and a red color filter 73. In a case of a complementary color type, the color filter 70 is formed by color filters of cyan, magenta, yellow, and green.

On the color filter 70, a flattening film 80, made of, for example, an acrylic thermoplastic resin, is formed. On the flattening film 80, a micro-lens 90 is formed.

In the above solid state imaging device, the incident light is focused by the micro-lens 90 and reaches the color filters 71, 72, and 73. Only light having predetermined wavelength bands passes through the color filters and strikes the light receiving portions 5. The light incident upon the light receiving portions 5 is opto-electrically converted to signal charges, in accordance with the incident light amount, and and these signal charges accumulate in the signal charge accumulation region 12. Thereafter, this is read out to the transfer channel 14 and transferred in the vertical direction by the vertical transfer portion 7.

Next, there is described a method of producing a solid state imaging device according to the second embodiment described above, with reference to FIGS. 22A to 22C to FIGS. 28A and 28B.

Figure 22A:
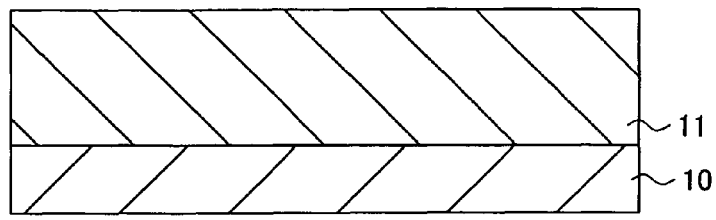
FIGS. 22A to 22C are sectional views of steps in the production of a solid state imaging device according to an embodiment of the present invention.

As shown in FIG. 22A, a p-type well 11 is formed in a substrate 10, made of n-type silicon, by ion implantation. At this time, a p-type well of the transistor 4a of the output portion 4 is also formed. As the substrate 10, for example, an n-type CZ substrate on which an n-type epitaxial layer having a resistivity of about 20 to 40 Ωcm, formed to several μm (micrometers) to several tens of μm (micrometers), is used.

Figure 22B:
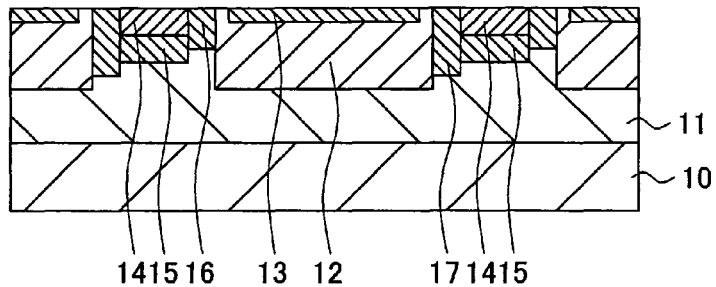

Next, as shown in FIG. 22B, an n-type signal charge accumulation region 12, a p-type positive hole accumulation region 13, an n-type transfer channel 14, a p-type region 15, a p-type read-out gate region 16, and a p-type channel stop region 17 are formed in the substrate by the ion implantation method.

Figure 22C:
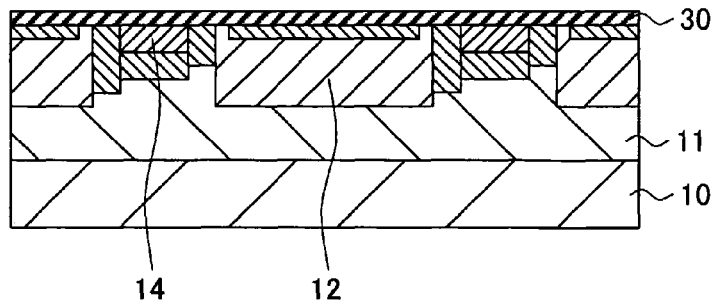

Next, as shown in FIG. 22C, a gate insulation film 30, made of a silicon oxide film, is formed on the substrate 10 by the thermal oxidation method. Note that, as the gate insulation film 30, a multilayer film of a silicon oxide film, a silicon nitride film, and a silicon oxide film may be formed. After forming the gate insulation film 30, various types of regions 12 to 17 described above may be formed.

Figure 23A:
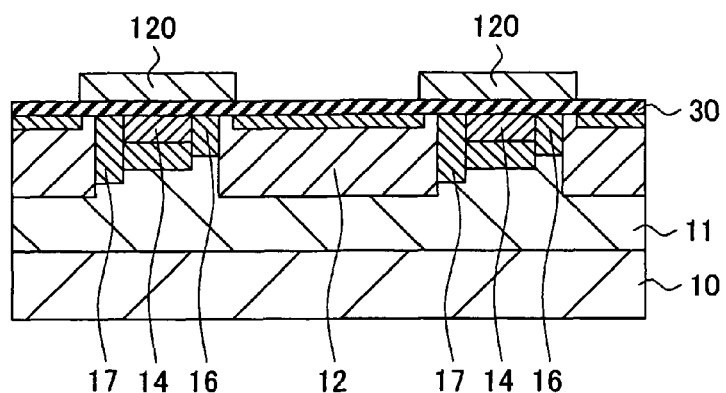
FIGS. 23A and 23B are sectional views of steps in the production of a solid state imaging device according to an embodiment of the present invention.

Next, as shown in FIG. 23A, a transfer electrode 120 is formed on the substrate 10 via the gate insulation film 30. A transfer electrode 120, having a single-layer structure, is formed, for example, by depositing a polycrystalline silicon layer on the substrate 10 and processing the polycrystalline silicon layer by photolithography and etching. The polycrystalline silicon layer is an embodiment of the conductive layer of the present invention. The thickness of the polycrystalline silicon layer is 200 nm to 500 nm. Due to this, a transfer electrode 120 for forming a first transfer electrode 121, a second transfer electrode 122, and a third transfer electrode 123 is formed. The pattern of the transfer electrode 120 is as shown in FIG. 16.

Figure 23B:
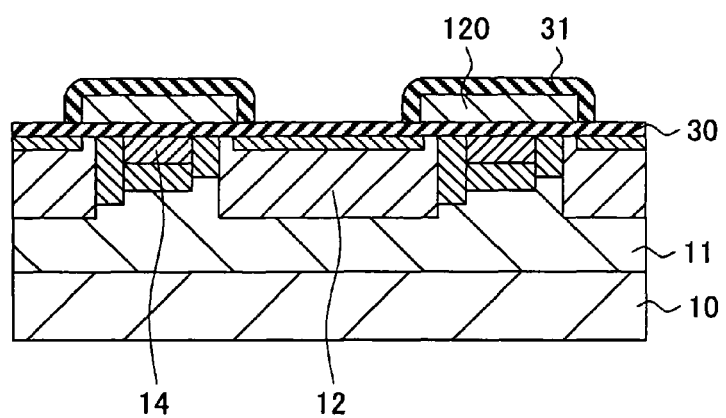

Next, as shown in FIG. 23B, an insulation film 31 is formed so as to cover the transfer electrode 20. The insulation film 31 is formed by depositing a silicon oxide film by, for example, the CVD process. The thickness of the insulation film 31 is set at approximately 100 nm so as to be durable against a drive voltage of 10-odd volts.

Figure 24A:
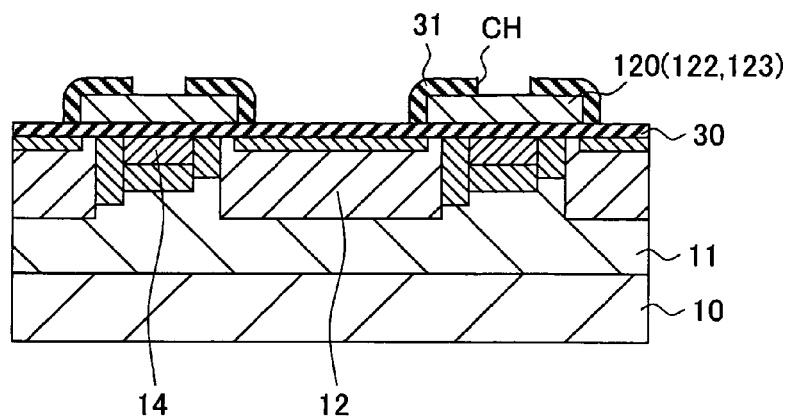
FIGS. 24A and 24B are sectional views of steps in the production of a solid state imaging device according to an embodiment of the present invention.

Next, as shown in FIG. 24A, by photolithography and etching, contact holes CH are formed in the insulation film 31 on the second transfer electrode 122 and the third transfer electrode 123. Note that when the buffer layer 141a is not necessary, the contact holes CH may be formed in only the insulation film 31 on the second transfer electrode 122.

Figure 24B:
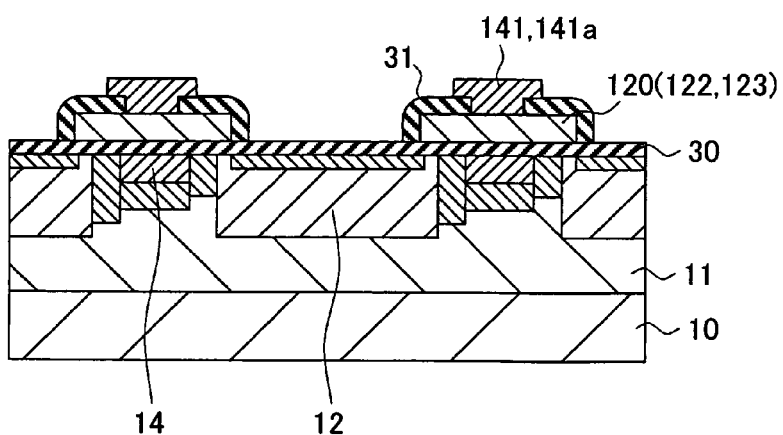

Next, as shown in FIG. 24B, a polycrystalline silicon layer is deposited on the entire surface and the polycrystalline silicon layer is processed by photolithography and etching to form a first drive interconnect 141 and the buffer layer 141a. The first drive interconnect 141 is connected to the second transfer electrode 122 via the contact hole CH. The buffer layer 141a is connected to the third transfer electrode 123 via the contact hole CH. The thickness of the polycrystalline silicon layer is 200 to 500 nm.

Figure 25A:
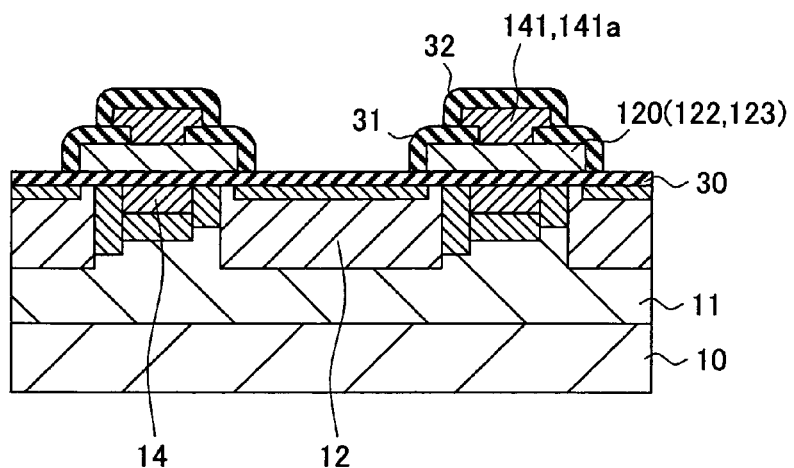
FIGS. 25A and 25B are sectional views of steps in the production of a solid state imaging device according to an embodiment of the present invention.

Next, as shown in FIG. 25A, an insulation film 32 is formed covering the first drive interconnect 141 and the buffer layer 141a. The insulation film 32 is formed by depositing a silicon oxide film by, for example, the CVD process. The thickness of the insulation film 32 is set at approximately 100 nm so as to be durable against a drive voltage of 10-odd volts.

Figure 25B:
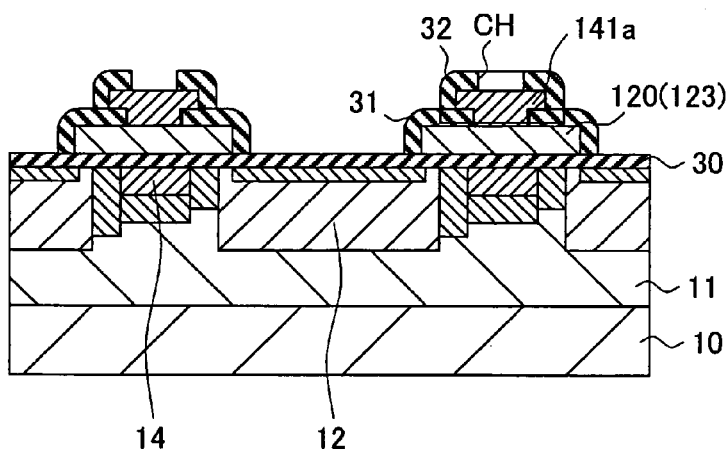

Next, as shown in FIG. 25B, by photolithography and etching, a contact hole CH is formed in the insulation film 32 on the third transfer electrode 123.

Figure 26A:
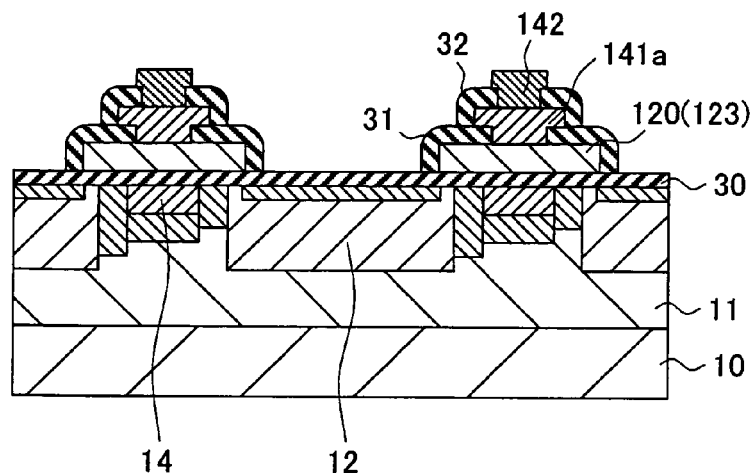
FIGS. 26A and 26B are sectional views of steps in the production of a solid state imaging device according to an embodiment of the present invention.

Next, as shown in FIG. 26A, a polycrystalline silicon layer is deposited on the entire surface and the polycrystalline silicon layer is processed by photolithography and etching to form a second drive interconnect 142. The second drive interconnect 142 is connected to the buffer layer 141a and the third transfer electrode 123 via the contact hole CH. When the polycrystalline silicon layer is used as the second drive interconnect 142, the thickness of the polycrystalline silicon layer is 200 to 500 nm. Note that when tungsten or another metal material having a low resistance is used as the second drive interconnect 142, the thickness can be made thinner than that of the case of the polycrystalline silicon layer.

Note that, although not shown, the reset gate RG of the transistor 4a of the output portion 4 is formed by utilizing the steps of formation of the transfer electrode 120 and the first drive interconnect 141 or the second drive interconnect 142 described above. Further, ion implantation for the formation of the reset drain RD and the floating diffusion FD of the transistor 4a is carried out.

Figure 26B:
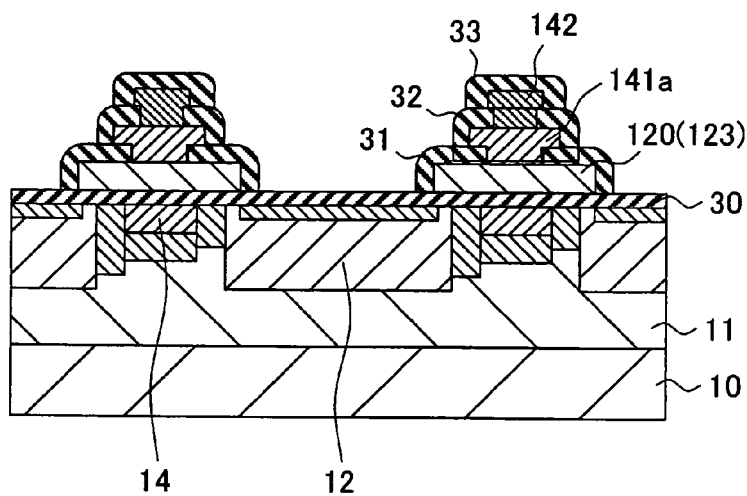

Next, as shown in FIG. 26B, an insulation film 33 covering the second drive interconnect 142 is formed. The insulation film 33 is formed by depositing a polycrystalline silicon oxide film by, for example, the CVD process. The thickness of the insulation film 33 is set at approximately 100 nm so as to be resist against a drive voltage of 10-odd volts.

Figure 27A:
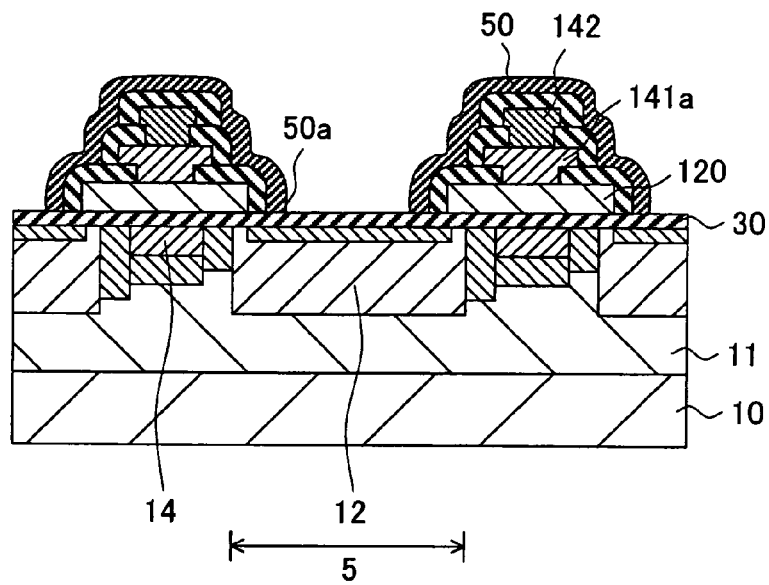
FIGS. 27A and 27B are sectional views of steps in the production of a solid state imaging device according to an embodiment of the present invention.

Next, as shown in FIG. 27A, a light shielding film 50, having an opening 50a at the location of the light receiving portion 5 and covering the transfer electrode 120 and the drive interconnects 141 and 142, is formed. The light shielding film 50 is formed, for example, by depositing tungsten or another high melting point metal film on the entire surface and processing the high melting point metal film by dry etching using a resist mask.

Figure 27B:
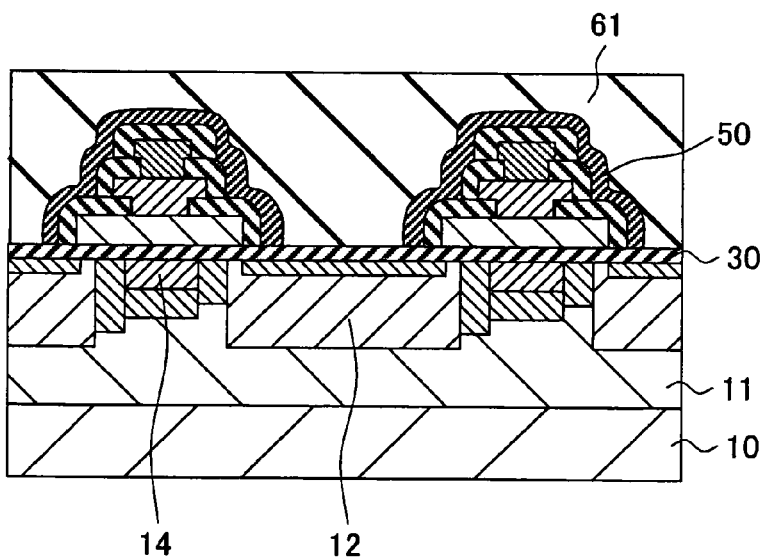

Next, as shown in FIG. 27B, on the substrate 10, for example, BPSG is deposited and reflow treatment is carried out to thereby form the inter-layer insulation film 61. Then, in the inter-layer insulation film 61, a contact hole (not shown) for connection to the floating diffusion FD and the reset drain RD of the transistor 4a of the output portion 4 is formed. Thereafter, an interconnect is formed on the inter-layer insulation film 61.

Figure 28A:
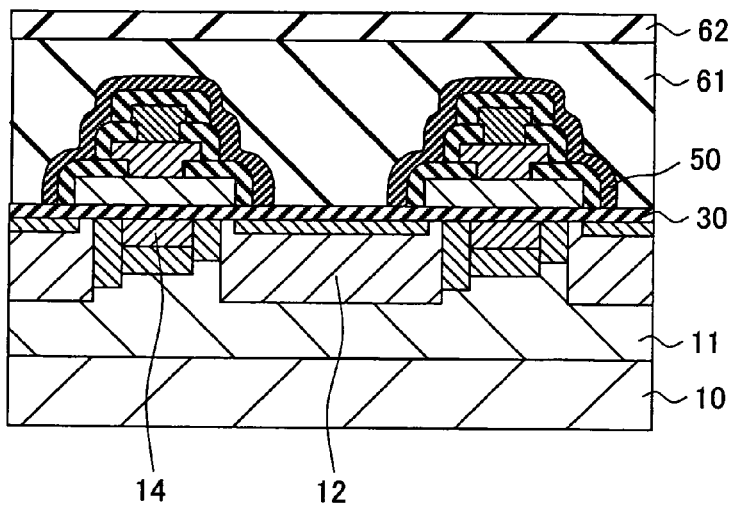
FIGS. 28A and 28B are sectional views of steps in the production of a solid state imaging device according to an embodiment of the present invention.

Next, as shown in FIG. 28A, a silicon nitride film is deposited on the inter-layer insulation film 61 by plasma CVD process, then the surface of the silicon nitride film is flattened to thereby form a passivation film 62.

Figure 28B:
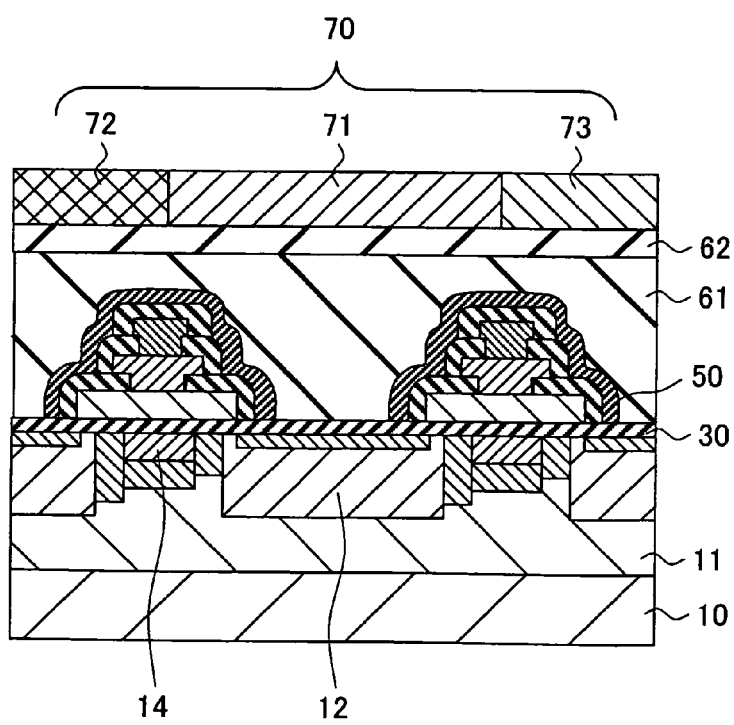

Next, as shown in FIG. 28B, a color filter 70 is formed on the passivation film 62. The color filter 70 is formed by using, for example, a color resist method. For example, by forming a green color resist on the passivation film 62 and then exposing and developing the green color resist, the pattern of the green color filter 71 is formed. By forming, exposing, and developing color resists in the same way, a blue color filter 72 and a red color filter 73 are formed. Note that the sequence of formation of the color filter 70 is not limited.

Next, in order to flatten the surface relief shapes of the color filter 70, a transparent flattening film 80 is formed on the color filter 70 (refer FIG. 19). As the flattening film 80, for example, an acrylic thermoplastic resin is used.

Next, a micro(very small)-lens 90 is formed on the flattening film 80 (refer FIG. 19). For example, by coating a lens material, then forming a resist mask having a lens shape and etching under conditions giving an etching selection ratio of the resist mask and the lens material of 1, a micro-lens 90 is formed.

The solid state imaging device according to the second embodiment is produced as explained above. The solid state imaging device may be used in a camera, for example, a video camera, digital still camera, or electronic endoscope camera.

FIG. 29 is a schematic view of the configuration of a camera in which the above solid state imaging device is used.

A camera 100 has the above solid state imaging device 1, an optical system 102, a drive circuit 103, and a signal processing circuit 104.

The optical system 102 focuses the image light (incident light) from the object to be imaged onto the imaging surface of the solid state imaging device 1. Due to this, the light receiving portions 5 of the solid state imaging device 1 convert the incident light to signal charges in accordance with the incident light amount and accumulate the signal charges in the signal charge accumulation region 12 of the light receiving portions 5 for a constant period.

The drive circuit 103 gives various types of timing signals such as transfer pulses $\phi V1$, $\phi V2$, and $\phi V3$ of three phases and transfer pulses $\phi H1$ and $\phi H2$ of two phases mentioned above to the solid state imaging device 1. Due to this, various types of drive such as reading, vertical transfer, and horizontal transfer of signal charges of the solid state imaging device 1 are carried out. Further, by this drive, analog image signals are output from the output portion 4 of the solid state imaging device 1.

The signal processing circuit 104 performs various types of signal processing such as noise elimination and conversion to digital signals with respect to the analog image signals output from the solid state imaging device 1. After the signal processing by the signal processing circuit 104, these are stored in a memory or other storage medium.

Next, there are described the effects of the solid state imaging device according to the second embodiment, the method of producing the same, and the camera.

In the solid state imaging device according to the second embodiment described above, the transfer electrodes 120 on the transfer channel 14 are formed by the first transfer electrodes 121, the second transfer electrodes 122, and the third transfer electrodes 123 having the single-layer structures. The first transfer electrodes 121 extend in the horizontal direction, and the second transfer electrodes 122 and the third transfer electrodes 123 are arranged separated from each other. The first drive interconnects 141 for supplying transfer pulses to the second transfer electrodes 122 in the same column are arranged so as to be superimposed on the first transfer electrodes 121 between light receiving portions 5. Further, the second drive interconnects 142 for supplying transfer pulses to the third transfer electrodes 123 in the same column are arranged so as to be superimposed on the first drive interconnects 141 between light receiving portions 5.

In the present embodiment, between light receiving portions 5 in the vertical direction, the first transfer electrodes 121, the first drive interconnects 141, and the second drive interconnects 142 are arranged overlapping (refer FIG. 18). For this reason, the interval between light receiving portions 5 in the vertical direction may need only be one interconnect width. As a result, the areas of the light receiving portions 5 can be made larger, and the amounts of charge handled by the light receiving portions 5 can be made larger. Accordingly, a solid state imaging device in which the light sensitivity is improved and the dynamic range is expanded can be realized. Since the areas of the light receiving portions 5 can be made larger, the potential of the light receiving portions 5 can be formed relatively shallow, and the read-out voltage can be reduced.

Further, in the second embodiment, transfer pulses having the same phase can be supplied to the second transfer electrodes 122 in the same column by the first drive interconnects 141 extending in the horizontal direction, and transfer pulses having the same phase can be supplied to the third transfer electrodes 123 in the same column by the second drive interconnects 142 extending in the horizontal direction. For this reason, the present invention can handle a variety of transfer modes such as the three-phase drive, the six-phase drive, and the nine-phase drive. Further, various types of transfer modes such as full pixel reading (progressive scan), frame reading (frame integration), and field reading (field integration) can be handle.

Further, the read-out voltage is supplied to one or both of the first drive interconnects 141 and the second drive interconnects 142. The first transfer electrodes 121 are formed at layers lower than these first drive interconnects 141 and the second drive interconnects 142, therefore, by the light shielding effect of the first transfer electrodes 121, the influence of the read-out voltage upon the potential of the channel stop region 17 of the inter-pixel portion can be suppressed. For this reason, the inflow/outflow of signal charges between light receiving portions 5 in the vertical direction can be suppressed.

On the transfer channel 14, widths of the first drive interconnect 141 and the second drive interconnect 142 in the horizontal direction are made narrower than the width of the transfer electrode 120 in the horizontal direction. For this reason, step differences at the left and right of the light receiving portions 5 can be made smaller in comparison with the case where transfer electrodes of multiple layers are employed. Due to this, the blocking of the incident light can be reduced, and the amount of incident light upon the light receiving portions 5 can be increased, so the present invention can contribute to the improvement of the light sensitivity.

In the inter-pixel portion in the vertical direction, widths of the first drive interconnect 141 and the second drive interconnect 142 in the vertical direction are made narrower than the width of the transfer electrode 120 in the vertical direction. For this reason, step differences formed at peripheral edge portions of the light receiving portions 5 in the vertical direction can be made smaller. Due to this, the elipsing (blocking) of the incident light can be reduced, and the amount of incident light upon the light receiving portions 5 can be increased, so the present invention can contribute to the improvement of the light sensitivity.

By arranging the second transfer electrodes 122 and the third transfer electrodes 123 adjacent to the light receiving portions 5, that is, at the side of the light receiving portions 5, and applying the read-out voltage to these second transfer electrodes 122 and third transfer electrodes 123, the width of the read-out gate can be broadened. Due to this, even when the read-out voltage is lowered, the read-out efficiency can be maintained.

As described above, according to the solid state imaging device in the second embodiment, a solid state imaging device, able to handle a variety of transfer modes and able to improve the light sensitivity, can be realized. By applying the solid state imaging device to a camera, a camera, able to handle a variety of transfer modes and improved in light sensitivity, can be realized.

According to the method of producing the solid state imaging device in the second embodiment, a solid state imaging device, able to handle a variety of transfer modes and able to improve the light sensitivity, can be produced.

The present invention is not limited to the embodiments described above. The present invention can be applied to, other than an interline-transfer type, a solid state imaging device of the frame transfer type or a frame interline-transfer type. Further, as the transfer electrode 120 and the first drive interconnect 141, other than polycrystalline silicon, a metal material such as tungsten or a silicide material can be used.

A variety of modifications are possible within the range not out of the gist of the present invention. In addition to the embodiments described above.

It should be understood by those skilled in the art that various modifications, combinations, sub-combinations and alterations may occur depending on design requirements and other factors insofar as they are within the scope of the appended claims or the equivalents thereof.

What I claim is:

1. A method of producing a solid state imaging device comprising:
    forming a read-out gate region of a first conductivity within a well of the first conductivity, a transfer channel of a second conductivity being between a channel stop region of the first conductivity and said read-out gate region;
    forming a positive hole accumulation region of the first conductivity within a signal charge accumulation region of the second conductivity, said signal charge accumulation region being within said well, and thereafter;
    forming a transfer electrode on a gate insulation film, said gate insulation film being between said read-out gate region and said transfer electrode.

2. The method as set forth in claim 1, wherein said first conductivity is p-type and said second conductivity is n-type.

3. The method as set forth in claim 1, wherein said first conductivity is opposite to said second conductivity.

4. The method as set forth in claim 1, wherein said well is formed within a substrate of the second conductivity.

5. The method as set forth in claim 4, wherein said well extends into said substrate from said gate insulation film.

6. The method as set forth in claim 1, wherein said positive hole accumulation region is between said gate insulation film and a segment of the signal charge accumulation region.

7. The method as set forth in claim 1, wherein a portion of the signal charge accumulation region is between said positive hole accumulation region and said read-out gate region.

8. The method as set forth in claim 7, wherein said gate insulation film is between said transfer electrode and said portion of the signal charge accumulation region.

9. The method as set forth in claim 1, wherein said gate insulation film is between said transfer electrode and said transfer channel.

10. The method as set forth in claim 1, wherein said gate insulation film is between said transfer electrode and said channel stop region.

11. The method as set forth in claim 1, wherein in a plan view of the solid state imaging device, a sidewall of said transfer electrode is spaced from said positive hole accumulation region in a first direction by at least an offset amount.

12. The method as set forth in claim 11, wherein said gate insulation film is between a different transfer electrode and said well, a sidewall of said different transfer electrode being spaced from said positive hole accumulation region in said first direction by at least a different offset amount.

13. The method as set forth in claim 11, wherein said positive hole accumulation region in said first direction is between said transfer electrode and said different transfer electrode.

14. The method as set forth in claim 1, further comprising:
    forming a barrier region of the first conductivity within said well, said barrier region being between said channel stop region and said read-out gate region.

15. The method as set forth in claim 14, wherein said transfer channel is between said transfer electrode and said barrier region.

16. The method as set forth in claim 1, wherein light receiving portions are arranged in a matrix, one of the light receiving portions including said positive hole accumulation region and said signal charge accumulation region.

17. The method as set forth in claim 1, wherein a light receiving portion includes said signal charge accumulation region and said positive hole accumulation region, said light receiving portion being configured to convert light into a signal charge.

18. The method as set forth in claim 17, further comprising:
    forming a color filter between said positive hole accumulation region and a micro-lens, said light through said micro-lens being incident upon said positive hole accumulation region.

19. The method as set forth in claim 17, further comprising: covering said transfer electrode with a light shielding film, an opening portion within said light shielding film exposing said positive hole accumulation region to said light.

* * * * *